(12) United States Patent
Ju et al.

(10) Patent No.: US 11,038,009 B2
(45) Date of Patent: Jun. 15, 2021

(54) SHADOW MASK FOR OLED EVAPORATION AND MANUFACTURING METHOD THEREFOR, AND OLED PANEL MANUFACTURING METHOD

(71) Applicant: SEEYA OPTRONICS CO., LTD., Shanghai (CN)

(72) Inventors: Yuhan Ju, Shanghai (CN); Tieer Gu, Shanghai (CN); Jie Kong, Shanghai (CN)

(73) Assignee: SEEYA OPTRONICS CO., LTD., Shanghai (CN)

(*) Notice: Subject to any disclaimer, the term of this patent is extended or adjusted under 35 U.S.C. 154(b) by 0 days.

(21) Appl. No.: 16/599,734

(22) Filed: Oct. 11, 2019

(65) Prior Publication Data

US 2020/0044010 A1    Feb. 6, 2020

Related U.S. Application Data

(63) Continuation of application No. PCT/CN2018/082414, filed on Apr. 10, 2018.

(30) Foreign Application Priority Data

Apr. 14, 2017    (CN) .......................... 201710245015.8

(51) Int. Cl.
*H01L 27/32*    (2006.01)
*H01L 25/04*    (2014.01)
(Continued)

(52) U.S. Cl.
CPC ........ *H01L 27/3283* (2013.01); *H01L 25/048* (2013.01); *H01L 27/3246* (2013.01);
(Continued)

(58) Field of Classification Search
None
See application file for complete search history.

(56) References Cited

U.S. PATENT DOCUMENTS 6,667,215 B2 * 12/2003 Theiss .................... B82Y 10/00
                                                          438/299
10,263,185 B2 * 4/2019 Matsueda ............. C23C 14/165
(Continued)

FOREIGN PATENT DOCUMENTS

CN    103589997 A    2/2014
CN    103864009 A    6/2014
(Continued)

*Primary Examiner* — Joe Schoenholtz
(74) *Attorney, Agent, or Firm* — Carlson, Gaskey & Olds

(57) ABSTRACT

A shadow mask used for OLED evaporation and a manufacturing method therefor, and an OLED panel manufacturing method. The shadow mask used for OLED evaporation includes: a semiconductor substrate including a front surface and a back surface opposite thereto, a recess penetrating the front surface and the back surface being provided in the semiconductor substrate; and a grid film layer provided on the front surface of the semiconductor substrate. A number of openings arranged in an array are provided in the grid film layer. Each of the openings has an upper portion and a lower portion. A width of the upper portion is greater than a width of the lower portion. The recess exposes the number of openings in the grid film layer and the grid film layer between adjacent openings.

25 Claims, 15 Drawing Sheets

(51) Int. Cl.
*H01L 51/00* (2006.01)
*H01L 51/56* (2006.01)

(52) U.S. Cl.
CPC ...... *H01L 51/0011* (2013.01); *H01L 51/0018* (2013.01); *H01L 51/56* (2013.01)

(56) References Cited

U.S. PATENT DOCUMENTS

| | | | | |
|---|---|---|---|---|
| 10,644,239 | B2 * | 5/2020 | Ghosh | C23C 14/042 |
| 2016/0141498 | A1 * | 5/2016 | Ghosh | C23C 14/042 |
| | | | | 438/34 |
| 2017/0121816 | A1 * | 5/2017 | Kim | C23C 14/564 |

FOREIGN PATENT DOCUMENTS

| | | |
|---|---|---|
| CN | 103866230 A | 6/2014 |
| JP | 2008196029 A | 8/2008 |

* cited by examiner

SHADOW MASK FOR OLED EVAPORATION AND MANUFACTURING METHOD THEREFOR, AND OLED PANEL MANUFACTURING METHOD

CROSS-REFERENCE TO RELATED APPLICATIONS

This application claims priority to Chinese Patent Application No. 201710245015.8, filed on Apr. 14, 2017, entitled "SHADOW MASK FOR OLED EVAPORATION AND MANUFACTURING METHOD THEREFOR, AND OLED PANEL MANUFACTURING METHOD", the content of which is incorporated herein by reference in its entirety.

TECHNICAL FIELD

The present disclosure relates to the field of OLED evaporation, and more particularly, to a high-precision shadow mask for OLED evaporation and a manufacturing method therefor, and an OLED panel manufacturing method.

BACKGROUND

The Organic Light-Emitting Diode (OLED) display panel has become more and more popular in the industry due to its advantages of self-illumination (no backlight source is required), high contrast, small thickness, wide viewing angle, fast response speed, applicability in flexible panels, wide operating temperature range, simple construction and process and the like.

An original color scheme of the OLED display panel is to produce a display unit that displays white light, and then use a corresponding color filter cooperatively. This technical solution requires the introduction of a color filter, and about 80% of light emission of a display sub-pixel is lost in the color filter due to the blocking of the color filter, such that the light-emitting power consumption and brightness performance of the OLED display panel are gradually unable to meet the demand for micro-display wearable applications. In addition, in this technical solution, microcavity lengths of three sub-pixels of red, green and blue having different wavelengths cannot be separately modulated, and the selectivity of the color filter is reduced. Therefore, the main display performances of the corresponding OLED display panel such as viewing angle color shift, dynamic static contrast and color gamut breadth are greatly reduced.

To this end, the industry proposes a technical solution for directly forming three primary color sub-pixels. This technical solution does not require a color filter, so that the loss of light emission of each sub-pixel is small, and the light-emitting power consumption and brightness performance of the OLED display panel are superior. Moreover, such OLED display panel can separately modulate the microcavities of the three sub-pixels of red, green and blue having different wavelengths. Therefore, the main display performances of the corresponding OLED display panel such as large viewing angle color shift, dynamic static contrast, and light gamut breadth are superior.

In the production process of an OLED display panel, one of the most important processes in the technical solution for directly forming three primary color sub-pixels is to deposit an organic layer (a light-emitting material) onto a base plate in accordance with the requirements of a driving matrix, to form structures such as various light-emitting display units. In this process, a metal shadow mask (or mask) and an evaporation source are required, and the metal shadow mask has a number of openings corresponding to a number of light-emitting units to be formed. Referring to FIG. 1 for the specific process: placing the base plate 12 in an evaporation chamber; placing a metal shadow mask 13 on a surface of the base plate 12; the gaseous light-emitting material generated by an evaporation source 11 diffusing onto the base plate 12 through a number of openings 15 in the metal shadow mask 13, and forming, on the base plate 12, light-emitting units 16 corresponding to the openings 15.

However, the existing forming an OLED panel by evaporation has problems of the large limit size of the sub-pixel (light-emitting unit) and low aperture ratio, such that the requirements of small-sized, high-resolution OLED panels cannot be met.

SUMMARY

The problem addressed by the present disclosure lies in how to reduce the limit size of an OLED panel and increase the aperture ratio of the OLED panel.

In order to solve the above problems, the present disclosure provides a method for manufacturing a shadow mask for OLED evaporation, including: providing a first semiconductor substrate, the first semiconductor substrate including a front surface and a back surface opposite thereto; forming a grid film layer on the front surface of the first semiconductor substrate; forming a number of openings arranged in an array in the grid film layer, wherein each of the openings has an upper portion and a lower portion and a width of the upper portion is greater than a width of the lower portion; providing a second semiconductor substrate, the second semiconductor substrate including a front surface and a back surface opposite thereto; bonding the second semiconductor substrate and the first semiconductor substrate, the front surface of the second semiconductor substrate facing the grid film layer on the front surface of the first semiconductor substrate; performing etching along the back surface of the second semiconductor substrate to remove a part of the second semiconductor substrate to form a recess in the second semiconductor substrate, the recess exposing the number of openings in the grid film layer and the grid film layer between adjacent openings; and removing the first semiconductor substrate to expose the grid film layer and the openings in the grid film layer.

Optionally, a process of forming the grid film layer includes: forming a grid thin film layer covering the front surface, the back surface, and side surfaces of the first semiconductor substrate; forming a first hard mask layer on a surface of the grid thin film layer on the front surface of the first semiconductor substrate; and performing etching to remove the grid thin film layer on the back surface and the side surfaces of the first semiconductor substrate, the grid thin film layer remaining on the front surface of the first semiconductor substrate serving as the grid film layer.

Optionally, the grid film layer and the grid thin film layer have tensile stress.

Optionally, the grid film layer and the grid thin film layer are made of a material of silicon nitride, the grid film layer and the grid thin film layer each have a thickness in a range of 1 to 1.5 micrometers, the tensile stress in a magnitude of 100 to 400 MPa, and a surface roughness smaller than 20 nanometers.

Optionally, a forming process of the grid thin film layer having tensile stress and made of the material of silicon nitride is a low-pressure furnace tube deposition process, the low-pressure furnace tube deposition process has a temperature greater than 600° C., a chamber pressure of 0.2 to 7 Torr, and gas including silane gas and NH3, the silane gas being one or more of SiH4, SiH2Cl2, or Si2H6.

Optionally, a process of forming a number of openings in the grid film layer includes: patterning the first hard mask layer; etching the grid film layer remaining on the front surface of the first semiconductor substrate by using the patterned first hard mask layer as a mask, to form the number of openings arranged in an array in the grid film layer; and removing the patterned first hard mask layer.

Optionally, an inclination angle of a sidewall of each of the openings is 40° to 80°, and a size of each of the openings is 2 to 20 micrometers.

Optionally, a material of the grid film layer is silicon oxide or silicon oxynitride.

Optionally, the method further includes, prior to said bonding: forming a second hard mask layer covering the back surface and side surfaces of the second semiconductor substrate; and forming a bonding layer on the front surface of the second semiconductor substrate.

Optionally, a material of the bonding layer is silicon oxide.

Optionally, a process of forming the recess includes: forming a patterned second photoresist layer on a surface of the second hard mask layer on the back surface of the second semiconductor substrate; etching the second hard mask layer on the back surface of the second semiconductor substrate by using the patterned second photoresist layer as a mask; and then etching the second semiconductor substrate and the bonding layer along the back surface of the second semiconductor substrate, to form the recess in the semiconductor substrate and the bonding layer, the recess exposing the number of openings in the grid film layer and the grid film layer between adjacent openings.

Optionally, the first semiconductor substrate is removed while etching the second semiconductor substrate.

Optionally, the method further includes, prior to said forming the second hard mask layer: forming a third hard mask layer on the front surface of the second semiconductor substrate, the third hard mask layer having a mesh-shaped opening exposing the front surface of the second semiconductor substrate; forming a mesh-shaped support layer in the second semiconductor substrate along the mesh-shaped opening, a surface of the support layer being flush with the front surface of the second semiconductor substrate; and removing the third hard mask layer.

Optionally, a process of forming the mesh-shaped support layer includes: doping B into the exposed second semiconductor substrate along the mesh-shaped opening; and then performing annealing.

Optionally, the doped B has a concentration greater than 1E22 atom/cm3 and a depth of 1 to 10 micrometers.

Optionally, a process of doping B is ion implantation, gas source diffusion, or solid source diffusion.

Optionally, the ion implantation has energy greater than 500 KeV and a dose greater than 1E17/cm2; the gas source diffusion uses gas of B2H6, a temperature greater than 600° C. and a pressure of 200 to 300 mtorr; and the solid source diffusion uses a boron nitride sheet as a solid source, gas of N2, a temperature of 1000 to 1200° C. and a pressure of 300 to mtorr.

Optionally, after said bonding, the mesh-shaped support layer is located on the bonding layer on a back surface of the grid film layer between adjacent openings.

Optionally, a width of the mesh-shaped support layer is smaller than a width of the grid film layer between adjacent openings.

Optionally, after the recess is formed, at least a part of the mesh-shaped support layer is connected to a part of the second semiconductor substrate exposed by the recess, or the mesh-shaped support layer is at least partially located in the second semiconductor substrate exposed by the recess.

Optionally, a material of the semiconductor substrate is silicon or germanium.

The present disclosure further provides a shadow mask for OLED evaporation, including: a semiconductor substrate including a front surface and a back surface opposite thereto, a recess penetrating the front surface and the back surface being provided in the semiconductor substrate; and a grid film layer provided on the front surface of the semiconductor substrate, a number of openings arranged in an array being provided in the grid film layer, wherein each of the openings has an upper portion and a lower portion, a width of the upper portion is greater than a width of the lower portion, and the recess exposes the number of openings in the grid film layer and the grid film layer between adjacent openings.

Optionally, the grid film layer has tensile stress.

Optionally, a material of the grid film layer is silicon nitride, the grid film layer has a thickness of 1 to 1.5 micrometers, the tensile stress in a magnitude of 100 to 400 MPa, and a surface roughness smaller than 20 nanometers.

Optionally, an inclination angle of a sidewall of each of the openings is 130° to 170°, and a size of each of the openings is 2 to 20 micrometers.

Optionally, a material of the grid film layer is silicon oxide or silicon oxynitride.

Optionally, a bonding layer is provided between the front surface of the semiconductor substrate and the grid film layer.

Optionally, a material of the bonding layer is silicon oxide.

Optionally, a back surface of the grid film layer between the openings is further provided with a mesh-shaped support layer, and the recess exposes the mesh-shaped support layer.

Optionally, a material of the mesh-shaped support layer is a B-doped semiconductor substrate material.

Optionally, a concentration of B doped in the mesh-shaped support layer is greater than 1E22 atom/cm3, and a thickness of the mesh-shaped support layer is 1 to 10 micrometers.

Optionally, a bonding layer is provided between the mesh-shaped support layer and the back surface of the grid film layer between adjacent openings.

Optionally, a width of the mesh-shaped support layer is smaller than a width of the grid film layer between adjacent openings.

Optionally, in addition to a part of the mesh-shaped support layer provided on the back surface of the grid film layer between adjacent openings, at least a part of the mesh-shaped support layer is connected to a part of the semiconductor substrate exposed by the recess, or at least a part of the mesh-shaped support layer is located in the semiconductor substrate exposed by the recess.

Optionally, a material of the semiconductor substrate is silicon or germanium.

An embodiment of the present disclosure further provides a method for manufacturing an OLED panel using the shadow mask described above, including: providing a base plate; transferring the base plate into an evaporation chamber; placing the shadow mask on a surface of the base plate in such a manner that the number of openings in the grid film layer on the shadow mask face the surface of the base plate to expose a part of the surface of the base plate by the number of openings in the grid film layer, wherein the recess in the shadow mask faces an evaporation source; and diffusing a gaseous light-emitting material generated by the evaporation source onto the base plate through the recess and the number of openings of the shadow mask, and forming, on the base plate, a light-emitting unit corresponding to the number of openings.

Compared with the related art, embodiments of the technical solution of the present disclosure may have the following features:

The present disclosure adopts a semiconductor integrated manufacturing process to manufacture a shadow mask, in which a grid film layer is formed on the front surface of the first semiconductor substrate; a number of openings arranged in an array are formed in the grid film layer, each of the openings having an upper portion and a lower portion and a width of the upper portion being greater than a width of the lower portion; a second semiconductor substrate is provided, the second semiconductor substrate including a front surface and a back surface opposite thereto; the second semiconductor substrate and the first semiconductor substrate are bonded, the front surface of the second semiconductor substrate facing the grid film layer on the front surface of the first semiconductor substrate; etching is performed along the back surface of the second semiconductor substrate to remove a part of the second semiconductor substrate to form a recess in the second semiconductor substrate, the recess exposing the number of openings in the grid film layer and the grid film layer between adjacent openings; and the first semiconductor substrate is removed to expose the grid film layer and the openings in the grid film layer. Namely, the shadow mask formed by the method of the present disclosure adopts a second semiconductor substrate having a recess as a main body support structure, and after a corresponding evaporation pattern (corresponding to the opening in the grid film layer) is formed on the grid film layer, the first semiconductor substrate and the second semiconductor substrate are bonded. Then the first semiconductor substrate is removed, such that the grid film layer having an opening is formed on the front surface of the second semiconductor substrate, and the second semiconductor substrate having a recess supports the grid film layer having an opening. Since the thickness of the second semiconductor substrate can be thick and the thickness of the grid film layer can be made thin, compared to the existing case in which an evaporation pattern is formed in the very thick invar alloy, the present disclosure can form, in the grid film layer having a large thickness, an evaporation pattern having a small size and a good morphology by a simple etching process. Moreover, the width of the upper portion of the opening formed in the grid film layer is greater than the width of the lower portion of the opening, so that after subsequently bonding the first semiconductor substrate and the second semiconductor substrate, and after etching the second semiconductor substrate to form the recess and removing the first semiconductor substrate, i.e., the grid film layer having an opening is located on the surface of the second semiconductor substrate, the opening in the corresponding grid film layer becomes an inverse tilted angle, i.e., the width of the portion (lower portion) of the opening in the grid film layer close to the recess is larger than the width of the portion (upper portion) facing away from the recess. When the shadow mask described above is used for evaporation, the grid film layer faces the base plate, and the recess faces the evaporation source. Therefore, when the evaporation gas diffuses through the recess and the opening onto the base plate, only the lower portion of the opening having a small width will limit the diffusion of the evaporation gas, while both the upper portion of the opening and the recess have wide widths and thus have small limitations on the diffusion of the evaporation gas, so that a light-emitting unit corresponding to the width of the lower portion of the opening is formed on the base plate, thereby preventing the generation of shadow effect or reducing the widths of the inner and outer shadows in the light-emitting unit during evaporation. Moreover, in the present disclosure, an opening is first formed in the grid film layer of the first semiconductor substrate and the width of the upper portion of the opening is greater than the width of the lower portion of the opening; then the second semiconductor substrate and the first semiconductor substrate are bonded, and the front surface of the second semiconductor substrate faces the grid film layer on the front surface of the first semiconductor substrate; then the first semiconductor substrate is removed, and a part of the second semiconductor substrate is removed by performing etching along the back surface of the second semiconductor substrate, to form a recess, exposing a number of openings in the grid film layer and the grid film layer between adjacent openings, in the second semiconductor substrate, thereby exposing the grid film layer and the opening in the grid film layer. In this way, the conversion of the positive tilted angle opening on the first semiconductor substrate to the inverse tilted angle on the second semiconductor substrate can be conveniently achieved with the simple process.

Further, the material of the second semiconductor substrate is silicon. Since silicon atoms in the second semiconductor substrate of the silicon material have a fixed crystal orientation, by using different etching rates of an alkaline solution on silicon materials having different crystal orientations, a recess having a good sidewall morphology can be conveniently formed in the second semiconductor substrate having a large thickness (several hundred micrometers to several millimeters) when subsequently etching the back surface of the second semiconductor substrate. In addition, since the density of silicon ($2.4$ g/cm$^3$) is much smaller than the density of invar alloy ($8.1$ g/cm$^3$), the weight of the shadow mask produced by the present disclosure is much smaller than that of the existing metal shadow mask made of invar metal. Therefore, the bending amount of the shadow mask produced by the present disclosure due to its own weight is much smaller than the bending amount of the existing metal shadow mask due to its own weight, such that it is ensured that the deformation amount caused by the bending amount of the opening formed in the grid film layer is very small, and during evaporation, the light-emitting unit formed by using the shadow mask of the present disclosure has the improved positional accuracy and the better morphology.

Further, a second hard mask layer is formed on the side surface and the back surface of the second semiconductor substrate. The second hard mask layer on the back surface of the second semiconductor substrate serves as the mask when the second semiconductor substrate is etched along the back surface of the second semiconductor substrate by wet etching to form a recess in the second semiconductor substrate. When the second semiconductor substrate is etched along the back surface of the second semiconductor substrate, the second hard mask layer on the side surface of the second semiconductor substrate causes the second semiconductor substrate on the side surface not to be etched, such that the remaining second semiconductor substrate material can maintain a good morphology to support the grid film layer on the front surface of the remaining second semiconductor substrate.

Further, the grid film layer has tensile stress, thereby preventing deformation of the suspended grid film layer caused by its own weight, improving the positional accuracy of the opening in the grid film layer and keeping the sidewall of the opening in the good morphology.

Further, the material of the grid film layer is silicon nitride, and the process of etching silicon nitride is simple, such that it is easy to form, in the silicon nitride material, an opening having a small size and a good morphology. The silicon nitride material has a high density, and when the subsequent grid film layer having an opening is suspended, the suspended grid film layer has the high mechanical stability and mechanical strength as well as the high corrosion resistance. In addition, it is possible to form a grid film layer having a uniform thickness and large tensile stress by a furnace tube low-pressure chemical vapor deposition process. The thickness of the grid thin film layer is 1 to 1.5 micrometers, and the magnitude of the tensile stress is 100 to 400 MPa. The surface roughness is smaller than 20 nanometers. Therefore, deformation caused by the own weight of the grid film layer is effectively overcome while ensuring the high mechanical stability, mechanical strength and corrosion resistance of the subsequently suspended grid film layer. Moreover, the opening having a small size can be easily formed in the grid film layer of 1 to 1.5 micrometers.

Further, a mesh-shaped support layer is formed on the back surface of the grid film layer between the adjacent openings. The mesh-shaped support layer can support the support layer having an opening when the grid film layer having an opening is suspended, which facilitates preventing the openings in the grid film layer from being deformed due to the own weight of the grid film layer.

Further, in addition to a part of the mesh-shaped support layer located on the back surface of the grid film layer between adjacent openings, at least a part of the mesh-shaped support layer is connected to a part of the second semiconductor substrate exposed by the recess, or at least a part of the mesh-shaped support layer is located in the second semiconductor substrate exposed by the recess, so as to further improve the support strength of the mesh-shaped support layer.

Further, by doping B in the second semiconductor substrate, when the second semiconductor substrate is subsequently etched along the back surface of the second semiconductor substrate to form a recess, the etching rate on the second semiconductor substrate material doped with B is much smaller than the etching rate on the second semiconductor substrate material that is not doped with B, such that when forming the recess, the B-doped second semiconductor substrate material on the back surface of the grid film layer between the openings is retained as the mesh-shaped support layer, thereby making it simple and convenient to form a mesh-shaped support layer with the high mechanical strength and good morphology.

Further, the concentration of the doped B is greater than 1E22 atom/cm$^3$. When the second semiconductor substrate is subsequently etched along the back surface of the second semiconductor substrate by using the TMAH or KOH etching solution to form a recess, the etched amount of the second semiconductor substrate material by the TMAH or KOH etching solution at such doping concentrations of B is negligible, such that the second semiconductor substrate doped with B can be completely retained as a mesh-shaped support layer, and the support layer has a good morphology. In addition, a doping depth of B is 1 to 10 micrometers, such that the thickness of the formed mesh-shaped support layer is at least 1 to 10 micrometers, which ensures the mechanical strength and mechanical stability of the mesh-shaped support layer itself, so as to better support the grid film layer having an opening on the surface.

Further, by organic combination of a grid film layer having tensile stress and a mesh-shaped support layer having a support structure, when the grid film layer having an opening is suspended, not only the deformation caused by the own weight of the grid film layer is overcome by the tensile stress of the grid film layer, but also the deformation caused by the own weight is further reduced by the support of the mesh-shaped support layer, thereby better ensuring that the opening subsequently formed in the grid film layer will not be deformed, which facilitates improving the positional accuracy of the light-emitting unit formed during evaporation and maintaining a good morphology, and also improving the mechanical strength and mechanical stability of the grid film layer having the opening and improving the service life of the shadow mask.

Further, a bonding layer is disposed between the front surface of the second semiconductor substrate and the grid film layer and between the mesh-shaped support layer and the grid film layer, in order to provide a high degree of firmness between the grid film layer and the front surface of the second semiconductor substrate, and to provide a high degree of firmness between the mesh-shaped support layer and the grid film layer.

The shadow mask of the present disclosure adopts a semiconductor substrate having a recess as a main body support structure and uses the grid film layer having an opening on the front surface of the semiconductor substrate as a mask during evaporation. Since the thickness of the second semiconductor substrate can be large and the thickness of the grid film layer can be made small, compared to the existing case in which an evaporation pattern is formed in the very thick invar alloy, the present disclosure can form, in the grid film layer having a small thickness, an evaporation pattern having a small size and a good morphology by a simple etching process. Moreover, the width of the portion (lower portion) of the opening in the grid film layer close to the recess is larger than the width of the portion (upper portion) facing away from the recess. When the shadow mask described above is used for evaporation, the grid film layer faces the base plate, and the recess faces the evaporation source. Therefore, when the evaporation gas diffuses through the recess and the opening onto the base plate, only the lower portion of the opening having a small width will limit the diffusion of the evaporation gas, while both the upper portion of the opening and the recess have wide widths and thus have small limitations on the diffusion of the evaporation gas, so that a light-emitting unit corresponding to the width of the lower portion of the opening is formed on the base plate, thereby preventing the generation of shadow effect or reducing widths of inner and outer shadows in the light-emitting unit during evaporation.

Further, the material of the semiconductor substrate is silicon, and since the density of silicon (2.4 g/cm$^3$) is much smaller than the density of invar alloy (8.1 g/cm$^3$), the weight of the shadow mask produced by the present disclosure is much smaller than that of the existing metal shadow mask made of invar metal. Therefore, the bending amount of the shadow mask produced by the present disclosure due to its own weight is much smaller than the bending amount of the existing metal shadow mask due to its own weight, such that it is ensured that the deformation amount caused by the bending amount of the opening formed in the grid film layer is very small, and during evaporation, the light-emitting unit formed by using the shadow mask of the present disclosure has the improved positional accuracy and the better morphology.

Further, in addition to a part of the mesh-shaped support layer located on the back surface of the grid film layer between adjacent openings, at least a part of the mesh-shaped support layer is connected to a part of the semiconductor substrate exposed by the recess, or at least a part of the mesh-shaped support layer is located in the semiconductor substrate exposed by the recess, so as to further improve the support strength of the mesh-shaped support layer.

Further, a bonding layer is disposed between the front surface of the semiconductor substrate and the grid film layer and between the mesh-shaped support layer and the grid film layer, in order to provide a high degree of firmness between the grid film layer and the front surface of the semiconductor substrate, and to provide a high degree of firmness between the mesh-shaped support layer and the grid film layer.

Further, since the grid film layer having the opening is suspended, by the organic combination of a grid film layer having tensile stress and a mesh-shaped support layer having a support structure, not only the deformation caused by the own weight of the grid film layer is overcome by the tensile stress of the grid film layer, but also the deformation caused by the own weight is further reduced by the support of the mesh-shaped support layer, thereby better ensuring that the opening subsequently formed in the grid film layer will not be deformed, which facilitates improving the positional accuracy of the light-emitting unit formed during evaporation and maintaining a good morphology, and also improving the mechanical strength and mechanical stability of the grid film layer having the opening and improving the service life of the shadow mask.

The method for manufacturing an OLED panel by using the foregoing shadow mask can form a light-emitting unit with a small size and a good morphology, and can greatly reduce the impact of the shadow effect (the width of the upper portion of the opening in the grid film layer is smaller than the width of the lower portion, so that during evaporation, only the lower portion of the opening having a small width will limit the diffusion of the evaporation gas, while both the upper portion of the opening and the recess have large widths and thus have small limitations on the diffusion of the evaporation gas, thereby forming, on the base plate, a light-emitting unit corresponding to the width of the lower portion of the opening, which greatly reduces the widths of the inner shadow and the outer shadow in the light-emitting unit) and improves the aperture ratio of the OLED panel.

DESCRIPTION OF EMBODIMENTS

As is known in the Background, the existing forming an OLED panel by evaporation has problems of the large limit size of the sub-pixel (light-emitting unit) and the low aperture ratio, such that the requirements of small-sized, high-resolution OLED panels cannot be met.

Research on the existing evaporation process has found that the size and shape of the opening in the existing metal shadow mask limits the size of the sub-pixel (light-emitting unit) formed by evaporation and the aperture ratio, i.e., the size of the opening in the existing metal shadow mask is still large, such that the sub-pixel (light-emitting unit) formed by evaporation using the metal shadow mask is still large, and it is difficult to ensure the morphology of the existing metal shadow mask, thereby affecting the morphology of the pixel (light-emitting unit) formed by evaporation and affecting the aperture ratio.

Figure 1:
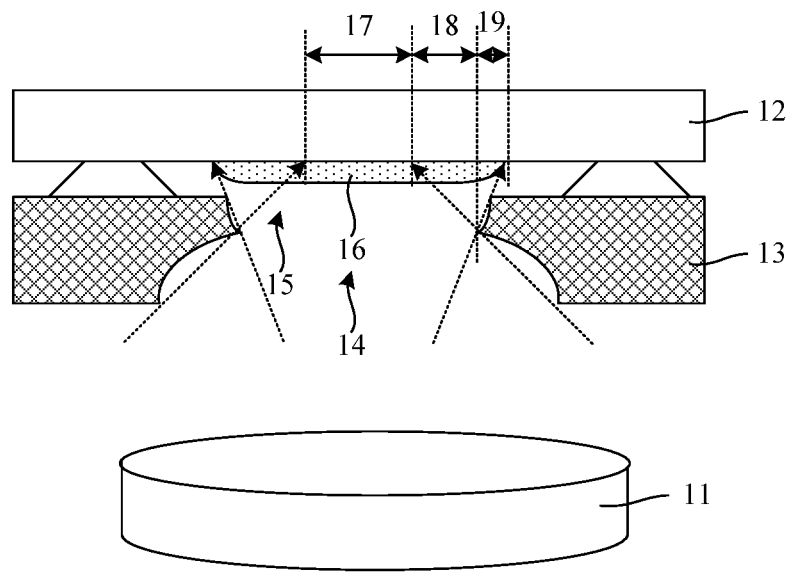
FIG. 1 is a structural schematic diagram showing manufacturing of an OLED by evaporation in the related art.

Further research found that the specific formation process of the above metal shadow mask lies in: providing an invar alloy plate having a thickness of several tens of micrometers to hundreds of micrometers; wet etching a front surface of the invar alloy plate and forming multiple first openings in the invar alloy plate; wet etching a back surface of the invar alloy plate, and forming multiple second openings in the invar alloy plate, each of the second openings and the corresponding first opening interpenetrating each other, and the interpenetrating first opening and the second opening constituting a mask pattern for forming a light-emitting unit; welding the back surface of the invar alloy plate having multiple first openings and second openings to a frame having a recess, the recess in the frame exposing the multiple second openings and the invar alloy plate between the second openings. Reference is made to the metal shadow mask 13 (the frame is not shown in the drawing) shown in FIG. 1 for details. The metal shadow mask 13 has a first opening 15 and a second opening 14 that are interpenetrating each other (only one first opening 15 and one second opening 14 are shown in FIG. 1 as an example). Due to the physical properties of invar alloy and the isotropic properties of wet etching, when forming a pattern (a first opening and a second opening penetrating through the first opening) in a thick (tens of micrometers to hundreds of micrometers) invar alloy plate, especially when manufacturing a pattern with a small feature size, it is difficult to ensure the morphology and the uniformity and consistency of the pattern feature size after isotropic wet etching, such that it is difficult to make the limit feature size of the opening small. Moreover, it is easy for the sidewall of the opening formed by wet etching to have curved sidewall morphology that is wide at the top and narrow at the bottom (referring to the sidewalls of the first opening and the second opening shown in FIG. 1 for details). Due to the properties of the evaporation process, the gaseous light-emitting material generated by the evaporation source 11 diffuses onto the base plate 12 through the multiple second openings 14 and the first openings 15 on the metal shadow mask 14, such that a light-emitting unit 16 corresponding to the multiple second openings 14 and the first openings 15 is formed on the base plate 12. Since the sidewall of the first opening 15 is a curved shape that is wide at the top and narrow at the bottom while the second opening 14 is a curved shape that is narrow at the top and wide at the bottom, the diffusion of the gaseous light-emitting material will be restricted, such that the formed light-emitting unit 16 has a film thickness assurance region 17, and an inner shadow region 18 and an outer shadow region 19 that are located on two sides of the film thickness assurance region.

Since the film thicknesses of the inner shadow region 18 and the outer shadow region 19 are not uniform, the inner shadow region 18 and the outer shadow region 19 cannot be used as effective light-emitting regions of the pixel, such that the effective light-emitting region of the pixel reduces, thereby affecting the aperture ratio (the formation of the inner shadow region 18 and the outer shadow region 19 during evaporation is called shadow effect, and the shadow effect should be avoided as possible during evaporation).

To this end, the present disclosure provides a shadow mask for OLED evaporation, a method for manufacturing the same, and a method for manufacturing an OLED panel. The manufacturing method for the shadow mask for OLED evaporation lies in: forming a grid film layer on a front surface of a first semiconductor substrate; forming a number of openings arranged in an array in the grid film layer, a width of an upper portion of the opening being greater than a width of a lower portion of the opening; providing a second semiconductor substrate including a front surface and a back surface opposite thereto; bonding the second semiconductor substrate and the first semiconductor substrate, the front surface of the second semiconductor substrate facing the grid film layer on the front surface of the first semiconductor substrate; performing etching along the back surface of the second semiconductor substrate to remove a part of the second semiconductor substrate, to form a recess, which exposes the openings in the grid film layer and the grid film layer between adjacent openings, in the second semiconductor substrate; and removing the first semiconductor substrate to expose the grid film layer and openings in the grid film layer. Namely, the shadow mask formed by the method of the present disclosure adopts the second semiconductor substrate having a recess as a main body support structure, and after a corresponding evaporation pattern (corresponding to the opening in the grid film layer) is formed on the grid film layer, the first semiconductor substrate and the second semiconductor substrate are bonded. Then the first semiconductor substrate is removed, such that the grid film layer having an opening is formed on the front surface of the second semiconductor substrate, and the second semiconductor substrate having a recess supports the grid film layer having an opening. Since the thickness of the second semiconductor substrate can be large and the thickness of the grid film layer can be made small, compared to the existing case in which an evaporation pattern is formed in the very thick invar alloy, the present disclosure can form, in the grid film layer having a small thickness, an evaporation pattern having a small size and a good morphology by a simple etching process. Moreover, the width of the upper portion of the opening formed in the grid film layer is greater than the width of the lower portion of the opening, so that after subsequently bonding the first semiconductor substrate and the second semiconductor substrate and then etching the second semiconductor substrate to form the recess and removing the first semiconductor substrate, i.e., the grid film layer having an opening is located on the surface of the second semiconductor substrate, the opening in the corresponding grid film layer becomes an inverse tilted angle, i.e., the width of the portion (lower portion) of the opening in the grid film layer close to the recess is larger than the width of the portion (upper portion) facing away from the recess. When the shadow mask described above is used for evaporation, the grid film layer faces the base plate, and the recess faces the evaporation source. Therefore, when the evaporation gas diffuses through the recess and the opening onto the base plate, only the lower portion of the opening having a small width will limit the diffusion of the evaporation gas, while both the upper portion of the opening and the recess have wide widths and thus have small limitations on the diffusion of the evaporation gas, so that a light-emitting unit corresponding to the width of the lower portion of the opening is formed on the base plate, thereby preventing the generation of shadow effect or reducing widths of inner and outer shadows in the light-emitting unit during evaporation. Moreover, in the present disclosure, an opening is first formed in the grid film layer of the first semiconductor substrate and the width of the upper portion of the opening is greater than the width of the lower portion of the opening; then the second semiconductor substrate and the first semiconductor substrate are bonded, and the front surface of the second semiconductor substrate faces the grid film layer on the front surface of the first semiconductor substrate; then the first semiconductor substrate is removed, and a part of the second semiconductor substrate is removed by performing etching along the back surface of the second semiconductor substrate, to form a recess, which exposes a number of openings in the grid film layer and the grid film layer between adjacent openings, in the second semiconductor substrate, and expose the grid film layer and the opening in the grid film layer, such that the conversion of the positive tilted angle opening on the first semiconductor substrate to the inverse tilted angle on the second semiconductor substrate can be conveniently achieved and the process is simple.

In order to make the above purposes, features and advantages of the present disclosure more apparent, the specific embodiments of the present disclosure will be described in detail below in conjunction with the drawings. When the embodiment of the present disclosure is described in detail, for the convenience of description, the schematic diagram will be enlarged locally without conforming to the general proportion, and the schematic diagram is only an example, which should not limit the scope of the present disclosure. In addition, three-dimensional dimensions of length, width and depth should be included in the actual manufacturing.

FIG. 2 to FIG. 17 are structural schematic diagrams showing a process for manufacturing a shadow mask for OLED evaporation according to an embodiment of the present disclosure.

Figure 2:
FIG. 2 to FIG. 17 are structural schematic diagrams showing a process for manufacturing a shadow mask for OLED evaporation according to an embodiment of the present disclosure.

Referring to FIG. 2, a first semiconductor substrate 201 is provided, and the first semiconductor substrate 201 includes a front surface and a back surface opposite thereto.

The front surface and the back surface of the first semiconductor substrate 201 are opposite to each other, and side surfaces are further provided between the front surface and the back surface. Referring to FIG. 2 for details, an upper surface of the first semiconductor substrate 201 described in FIG. 2 is defined as the front surface, and a lower surface is defined as the back surface. Two side surfaces between the upper surface and the lower surface are defined as the side surfaces.

The first semiconductor substrate 201 serves as a platform for subsequently forming a grid film layer. The first semiconductor substrate 201 and a subsequent second semiconductor substrate may be made of a same material or different materials.

Figure 3:
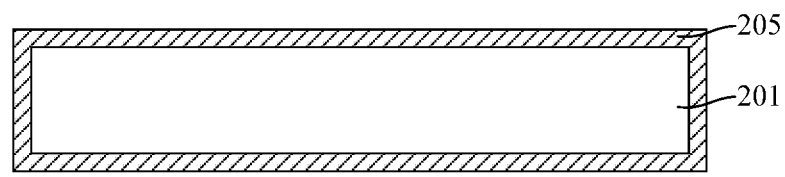
Figure 4:
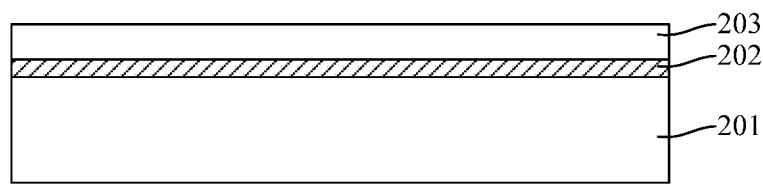

Referring to FIG. 3 and FIG. 4, a grid film layer 202 is formed on the front surface of the first semiconductor substrate 201.

In the present embodiment, the formation process of the grid film layer 202 lies in, referring to FIG. 3, forming a grid thin film layer 205 that covers the front surface, the back surface and the side surfaces of the first semiconductor substrate 201; and referring to FIG. 4, forming a first hard mask layer 203 on a surface of the grid thin film layer 205 on the front surface of the first semiconductor substrate; performing etching to remove the grid thin film layer on the back surface and the side surfaces of the first semiconductor substrate 201, and using the grid thin film layer remaining on the front surface of the first semiconductor substrate 201 as the grid film layer 202. In other embodiments, it is possible that only a grid thin film covering the front surface of the first semiconductor substrate is formed as the grid film layer.

The purpose of first forming the grid thin film layer 205 covering the front surface, the back surface and the side surfaces of the first semiconductor substrate 201, performing etching to remove the grid film layer on the back surface and the side surfaces of the first semiconductor substrate 201 and using the grid thin film layer remaining on the front surface of the first semiconductor substrate 201 as the grid film layer 202 lies in that a grid thin film layer having a uniform thickness and large tensile stress can be easily formed by a furnace tube low-pressure chemical vapor deposition process.

A number of openings are subsequently formed in the grid film layer 202 formed on the front surface of the first semiconductor substrate 201, as a mask layer during evaporation. After the openings are formed in the grid film layer, the first semiconductor substrate 201 and the second semiconductor substrate are subsequently bonded. After removing the first semiconductor substrate, the formed grid film layer 202 with the openings is configured to be located on a front surface of the second semiconductor substrate. The second semiconductor substrate serves as a support structure for supporting the grid film layer. Therefore, compared with the existing metal shadow mask, the forming method of a shadow mask in the present disclosure can form, in the grid film layer 202, an evaporation pattern (opening) having a small size and a good morphology, since the formed grid film layer 202 can be thin (1 to 1.5 micrometers) and the etching process can be simple.

After bonding first semiconductor substrate 201 and the second semiconductor substrate and then etching the second semiconductor substrate to form a recess and removing the first semiconductor substrate, the grid film layer having a number of openings on the front surface of the second semiconductor substrate is suspended. In the present embodiment, the grid thin film layer 205 and the grid film layer 202 have tensile stress, thereby preventing deformation of the suspended grid film layer caused by its own weight, improving the positional accuracy of the opening in the grid film layer and keeping the sidewall of the opening in the good morphology.

In the present embodiment, the material of the grid thin film layer 205 and the grid film layer 202 is silicon nitride, and the process of etching silicon nitride is simple, such that it is easy to form, in the silicon nitride material, an opening having a small size and a good morphology. The silicon nitride material has a high density, and when the subsequent grid film layer having an opening is suspended, the suspended grid film layer has the high mechanical stability and mechanical strength as well as the high corrosion resistance. In addition, it is possible to form a grid film layer having a uniform thickness and large tensile stress by a furnace tube low-pressure chemical vapor deposition process. The thicknesses of the grid thin film layer 205 and the grid film layer 202 are in 1 to 1.5 micrometers, and may be 1.5 micrometers, 2 micrometers, 2.5 micrometers, 3 micrometers, 4 micrometers, or 4.5 micrometers. The magnitude of the tensile stress is 100 to 400 MPa, and may be 150 MPa, 200 MPa, 250 MPa, 300 MPa, or 350 MPa. The surface roughness is smaller than 20 nanometers. Therefore, deformation caused by the own weight of the grid film layer is effectively overcome while ensuring the high mechanical stability, mechanical strength and corrosion resistance of the subsequently suspended grid film layer. Moreover, the opening having a small size can be easily formed in the grid film layer of 1 to 1.5 micrometers. This can prevent the grid film layer from being too thin, which would otherwise cause it to be damaged during the subsequent process, and is also prevented from being too thick, which would otherwise cause the substrate to warp due to the excessively large stress.

In one embodiment, the formation process of the grid thin film layer 205, which covers the front surface, the back surface, and the side surfaces of the first semiconductor substrate 201, has tensile stress and is made of a material of silicon nitride, is a low-pressure furnace tube deposition process. As for the low-pressure furnace tube deposition process, the temperature is greater than 600° C., the chamber pressure is 0.2 to 7 Torr, and the gas includes silane gas and NH3. When the grid thin film layer 205 is formed by the low-pressure furnace tube deposition process, the grid thin film layer 205 can be simultaneously formed on the entire surface (a front surface, a back surface, and side surfaces) of a semiconductor substrate on an insulator. In addition to the simple forming process, the thickness of the grid thin film layer 205 is uniform and the surface roughness is low. Moreover, the tensile stress distribution at various positions of the film layer is uniform and it is easy to control the magnitude of the stress.

In other embodiments, the material of the grid film layer may also be silicon oxide or silicon oxynitride.

The material of the first hard mask layer 203 is different from the material of the grid film layer 202. In an embodiment, the material of the first hard mask layer may be one or more of Al, silicon oxide, amorphous carbon, TiN, Ti, TaN, and Ta.

In the present embodiment, the grid film layer has a single layer structure. In other embodiments, the grid film layer may have a structure stacked by multiple layers (two or more layers).

Figure 5:
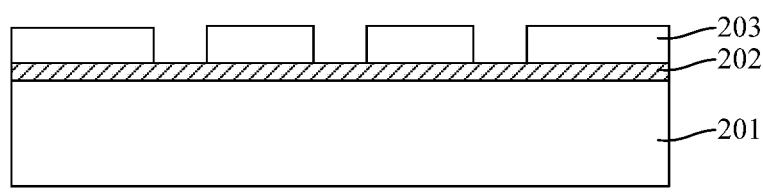
Figure 6:
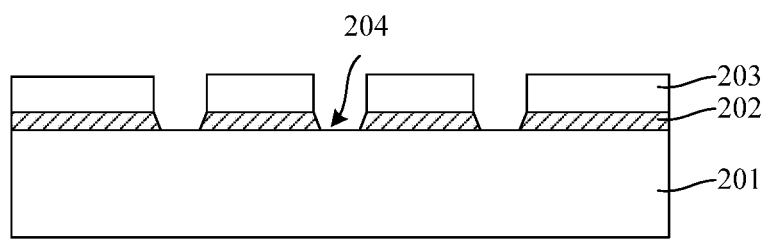
Figure 7:
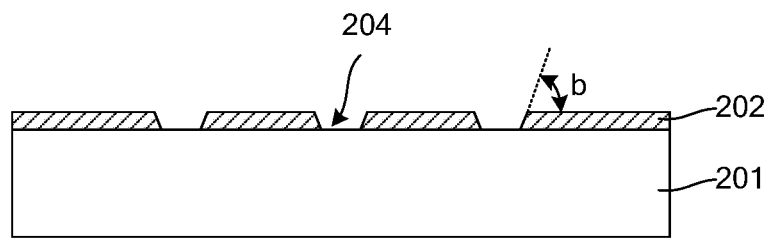

Referring to FIGS. 5, 6, and 7, a number of openings 204 arranged in an array are formed in the grid film layer 202, and a width of an upper portion of the opening 204 is greater than a width of a lower portion of the opening.

In the present embodiment, the process for forming a number of openings 204 in the grid film layer 202 includes: referring to FIG. 5, patterning the first hard mask layer 203; referring to FIG. 6, etching the remaining grid film layer 202 on the front surface of the first semiconductor substrate 201 by using the patterned first hard mask layer 203 as a mask to form a number of openings arranged in an array in the grid film layer 202; and referring to FIG. 7, removing the patterned first hard mask layer.

In an embodiment, the process of patterning the first hard mask layer 203 includes: forming a photoresist layer (not shown in the drawings) on the first hard mask layer 203; patterning the photoresist layer by exposure and development processes; and etching the first hard mask layer by using the patterned photoresist layer as a mask.

In the present embodiment, the width of the upper portion of the opening 204 is greater than the width of the lower portion of the opening, or the width of the opening gradually decreases from the top to the bottom. After subsequently bonding the first semiconductor substrate 201 and the second semiconductor substrate, and then etching the second semiconductor substrate to form the recess and removing the first semiconductor substrate, i.e., the grid film layer having the opening is located on the surface of the second semiconductor substrate, the opening in the corresponding grid film layer becomes an inverse tilted angle, i.e., the width of the portion (lower portion) of the opening in the grid film layer close to the recess is larger than the width of the portion (upper portion) facing away from the recess. When the evaporation gas diffuses through the recess and the opening onto the base plate, only the lower portion of the opening having a small width will limit the diffusion of the evaporation gas, while both the upper portion of the opening and the recess have wide widths and thus have small limitations on the diffusion of the evaporation gas, so that a light-emitting unit corresponding to the width of the lower portion of the opening is formed on the base plate, thereby preventing the generation of shadow effect or reducing widths of inner and outer shadows in the light-emitting unit during evaporation. It should be noted that before the first semiconductor substrate and the second semiconductor substrate are bonded, the upper portion of the opening 204 is the portion of the opening facing away from the front surface of the first semiconductor substrate 201, and the lower portion of the opening is the portion of the opening close to the front surface of the first semiconductor substrate 201. From the top to the bottom refers to a direction from facing away from the front surface of first semiconductor substrate to being close to the front surface of the first semiconductor substrate. The sidewall morphology of the opening 204 may be an inclined plane, an inclined curved side surface or an inclined stepped surface. After bonding the first semiconductor substrate and the second semiconductor substrate and then forming the recess in the second semiconductor substrate and removing the first semiconductor substrate, the upper portion of the opening is the portion close to the recess, and the lower portion of the opening is the portion facing away from the recess.

In an embodiment, an inclination angle b of a sidewall of the opening 204 is 40° to 80°. The opening 204 has a size of 2 to 20 micrometers. The inclination angle of the sidewall of the opening 204 is an angle between a surface of the sidewall or a tangent to the surface of the sidewall and the surface of the first semiconductor substrate 202.

Etching the grid film layer 202 to form the opening 204 may employ a wet etching or a dry etching process. In an embodiment, the wet etching may employ a phosphoric acid solution. In another embodiment, the dry etching process is plasma etching, the gas used in the plasma etching is one or more of CH3F and CH2F2, the reaction chamber pressure is 10 mTorr to 100 mTorr, the chamber temperature is 20 degrees to 100 degrees, the output power of the RF power source is 60 watts to 1000 watts, and the output power of the RF bias power source is 100 watts to 400 watts, such that an opening 204 having a good morphology and an inclined sidewall is formed.

The first hard mask layer may be removed by a wet or dry etching process.

In other embodiments, it is possible that no first hard mask layer is formed, and a photoresist layer may be directly formed on the surface of the grid film layer. Then, the photoresist layer is patterned, and the grid film layer is etched using the patterned photoresist layer as a mask. A number of openings arranged in an array are formed in the grid film layer, and the width of the upper portion of the opening is greater than the width of the lower portion of the opening.

The openings formed in the grid film layer 202 are mutually discrete. The openings are arranged in an array in the grid film layer 202, and the array arrangement may be a matrix arrangement or other arrangement.

Figure 8:
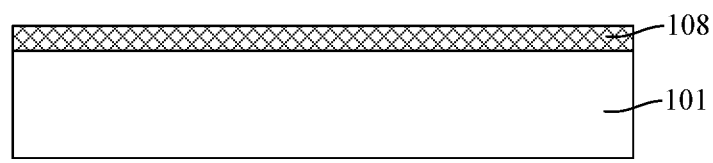

Referring to FIG. 8, a second semiconductor substrate 101 is provided, and the second semiconductor substrate 101 includes a front surface and a back surface opposite thereto.

The front surface and the back surface of the second semiconductor substrate 101 are opposite to each other, and side surfaces are further provided between the front surface and the back surface. Referring to FIG. 8 for details, an upper surface of the second semiconductor substrate 101 described in FIG. 8 is defined as the front surface, a lower surface is defined as the back surface, and two side surfaces between the upper surface and the lower surface are defined as the side surfaces.

The second semiconductor substrate 101 is used to form a main body support structure of the shadow mask. Namely, the semiconductor substrate remaining after the subsequent etching along the back surface of the semiconductor substrate 101 to form a recess (the recess exposes a number of openings and the grid film layer between the openings) can support a grid film layer having a number of openings on the front surface of the semiconductor substrate.

The material of the second semiconductor substrate 101 may be silicon or germanium. In one embodiment, the second semiconductor substrate 101 has a thickness of 500 to 725 micrometers.

In the present embodiment, the material of the second semiconductor substrate 101 is silicon. Since silicon atoms in the second semiconductor substrate 101 of the silicon material have a fixed crystal orientation, by using different etching rates of an alkaline solution on silicon materials having different crystal orientations, a recess having a good sidewall morphology can be conveniently formed in the second semiconductor substrate 101 having a large thickness (several hundred micrometers to several millimeters) when subsequently etching the back surface of the second semiconductor substrate 101. In addition, since the density of silicon (2.4 g/cm$^3$) is much smaller than the density of invar alloy (8.1 g/cm$^3$), the weight of the shadow mask produced by the present disclosure is much smaller than that of the existing metal shadow mask made of invar metal. Therefore, the bending amount of the shadow mask produced by the present disclosure due to its own weight is much smaller than the bending amount of the existing metal shadow mask due to its own weight, such that it is ensured that the deformation amount caused by the bending amount of the opening formed in the grid film layer is very small, and during evaporation, the light-emitting unit formed by using the shadow mask of the present disclosure has the improved positional accuracy and the better morphology. In addition, since the thermal expansion coefficient of the silicon material is small (close to the thermal expansion coefficient of the invar metal), the deformation amount of the shadow mask caused by being heated during evaporation is also very small. Further, the silicon material also has the advantages of no adhesion and plasticity, so that the semiconductor substrate 101 is less likely to be deformed during the manufacturing process.

A protective layer 108 is further formed in the front surface of the second semiconductor substrate 101. The protective layer 108 protects the front surface of the second semiconductor substrate 101 from being damaged when a second mask layer is subsequently formed on the side surface and the back surface of the second semiconductor substrate 101.

In an embodiment, the material of the protective layer 108 may be silicon oxide, silicon carbide or amorphous carbon.

Figure 9:
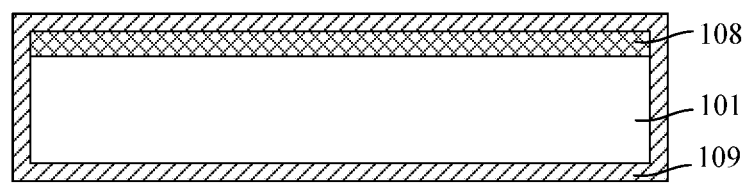
Figure 10:
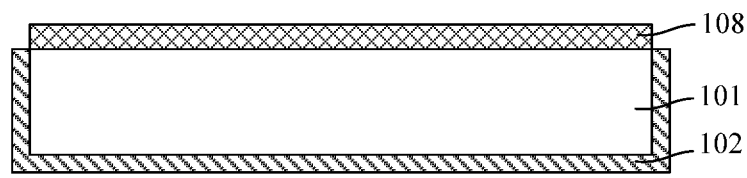

Referring to FIGS. 9 and 10, a second hard mask layer 102 is formed on the side surfaces and the back surface of the second semiconductor substrate 101.

The material of the second hard mask layer 102 is different from the material of the second semiconductor substrate 101. The second hard mask layer 102 on the back surface of the second semiconductor substrate serves as the mask when the second semiconductor substrate is subsequently etched along the back surface of the second semiconductor substrate by wet etching to form a recess in the second semiconductor substrate. When the second semiconductor substrate is etched along the back surface of the second semiconductor substrate, the second hard mask layer 102 on the side surfaces of the second semiconductor substrate causes the second semiconductor substrate on the side surfaces not to be etched, such that the remaining second semiconductor substrate material can maintain a good morphology to support the grid film layer on the front surface of the remaining second semiconductor substrate.

The second hard mask layer 102 may be silicon nitride, silicon oxide, silicon oxynitride, silicon carbide, silicon carbonitride, titanium nitride or tantalum nitride.

The formation process of the second hard mask layer 102 lies in: after forming the protective layer 108 on the front surface of the second semiconductor substrate 101, forming a hard mask thin film layer 109 covering the surface of the protective layer 108 and the side surfaces and the bottom surface of the second semiconductor substrate 101 by a deposition process (referring to FIG. 9); performing etching to remove the hard mask thin film layer on the front surface of the second semiconductor substrate 101, and forming a second hard mask layer on the back surface and the side surfaces of the second semiconductor substrate 101.

A dry etching process is used to perform etching to remove the hard mask thin film layer on the front surface of the second semiconductor substrate 101.

Figure 11:
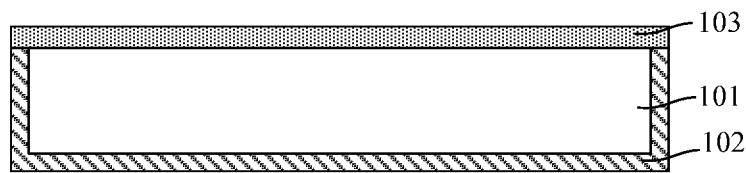

Referring to FIG. 11, the protective layer 108 (referring to FIG. 10) is removed, and a bonding layer 103 is formed on the front surface of the second semiconductor substrate 101.

The bonding layer 103 is used for subsequent bonding of the first semiconductor substrate 201 (referring to FIG. 7) and the second semiconductor substrate 101. In the present embodiment, the material of the bonding layer 103 is silicon oxide, and the forming process is thermal oxidation.

It should be noted that the bonding layer 103 may adopt other bonding materials according to the needs of the bonding process.

Figure 12:
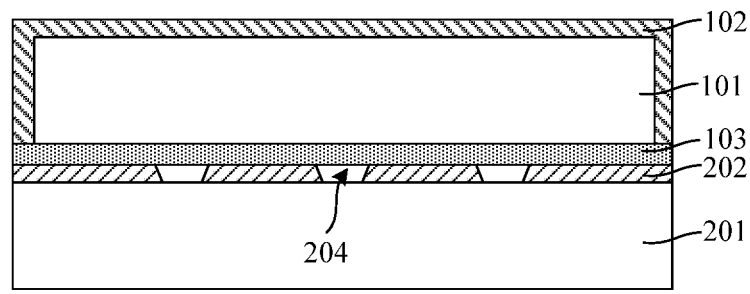

Referring to FIG. 12, the second semiconductor substrate 101 and the first semiconductor substrate 201 are bonded, and the front surface of the second semiconductor substrate 101 faces the grid film layer 202 on the front surface of the first semiconductor substrate 201.

In the present embodiment, the bonding layer 103 on the front surface of the second semiconductor substrate 101 is in contact with the grid film layer 202 on the front surface of the first semiconductor substrate 201.

The bonding process uses a direct bonding process.

Figure 13:
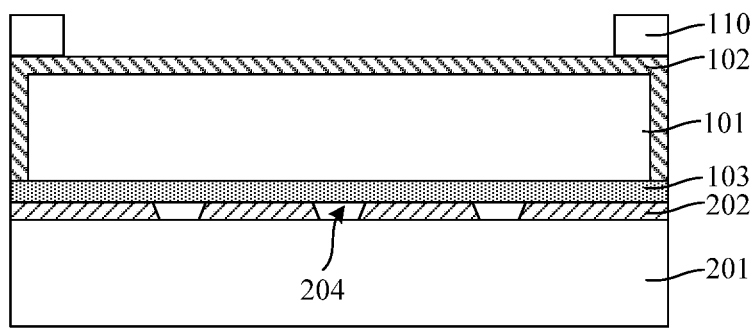
Figure 14:
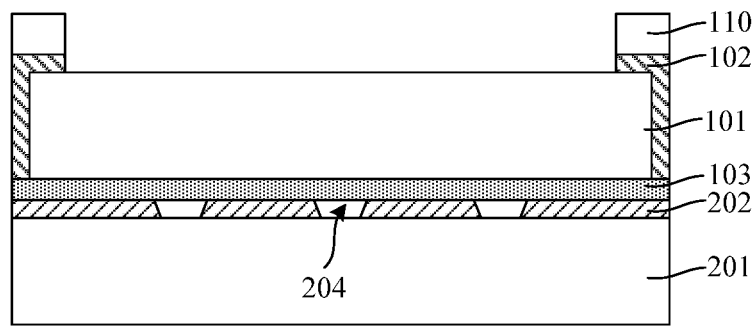
Figure 15:
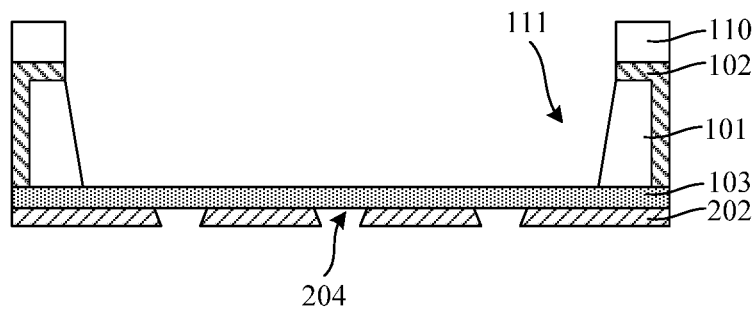

Referring to FIGS. 13 to 15, a part of the second semiconductor substrate 101 is removed by performing etching along the back surface of the second semiconductor substrate 101, and a recess 111, which exposes a number of openings 204 in the grid film layer 202 and the grid film layer between adjacent openings 204, is formed in the second semiconductor substrate 101.

Figure 16:
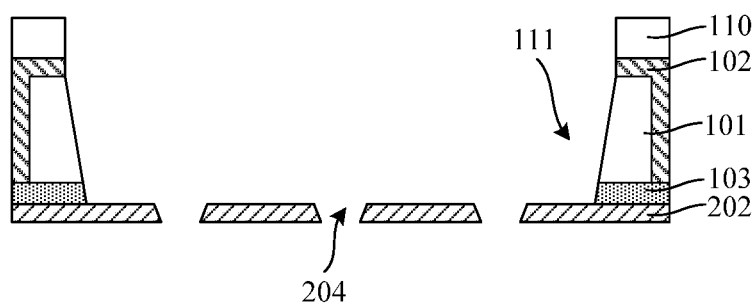

In the present embodiment, the forming process of the recess 111 includes: referring to FIG. 14, forming a patterned second photoresist layer 110 on the surface of the second hard mask layer 102 on the back surface of the second semiconductor substrate 101; etching the second hard mask layer 102 on the back surface of the second semiconductor substrate 101 by using the patterned second photoresist layer 110 as a mask; referring to FIGS. 15 and 16, then etching the second semiconductor substrate 101 and the bonding layer 103 along the back surface of the second semiconductor substrate 101 to form a recess 111, which exposes a number of openings 204 in the grid film layer 202 and the grid film layer between adjacent openings 204, in the semiconductor substrate 101 and the bonding layer 103.

Referring to FIG. 14, the forming process of the patterned second photoresist layer 110 lies in: forming a photoresist layer on the surface of the second hard mask layer 102 on the back surface of the second semiconductor substrate 101 by a spin coating process; and pattering the photoresist layer using an exposure and development process to form a patterned second photoresist layer 110.

Referring to FIG. 15, a method of etching a second hard mask layer 102 on the back surface of the second semiconductor substrate 101 is performed by a dry etching process. In one embodiment, the dry etching process is a plasma etching process, and the etching gas used in the plasma etching process includes a fluorine-containing gas.

Etching the second semiconductor substrate 101 employs a wet etching process. The etching solution used for wet etching is TMAH (tetramethylammonium hydroxide) or KOH solution. Due to different etching rates of the TMAH (tetramethylammonium hydroxide) or KOH solution on silicon materials having different crystal orientations when etching silicon materials, it is possible to easily form the recess 111 having an upper portion with a large width and a lower portion with a small width. In addition, when etching, the etching rate of the etching solution on the material of the second hard mask layer 102 is extremely low, so that the second hard mask layer 102 on the side surface of the second semiconductor substrate 101 protects the side surface of the second semiconductor substrate from being etched. Moreover, when etching, the etching rate of the etching solution on the grid film layer 202 is also extremely low, so that the grid film layer 202 can be kept intact.

In the present embodiment, the width of the recess 111 gradually reduces from the upper portion (the portion close to the back surface of the second semiconductor substrate 101) to the lower portion (the portion close to the front surface of the second semiconductor substrate 101). Namely, the width of the upper portion of the recess 111 is large and the width of the lower portion is small. Since the recess 111 faces the evaporation source during evaporation, the opening edge of the recess 111 will not affect the diffusion of the evaporation gas when the width of the upper portion of the recess 111 is large, thereby improving the inner shadow and the outer shadow of the light-emitting unit formed by evaporation.

In the present embodiment, when the material of the first semiconductor substrate 201 is the same as the material of the second semiconductor substrate 101, while etching the second semiconductor substrate 101, the first semiconductor substrate 201 is removed by etching (referring to FIG. 14) to expose the grid film layer 202 and the openings 204 in the grid film layer 202. In other embodiments, when the material of the first semiconductor substrate is different from the material of the second semiconductor substrate, the first semiconductor substrate 201 may be removed using a lift-off process.

Referring to FIG. 16, etching is performed on the bonding layer 103 by a wet etching process, and the etching solution used in the wet etching process is an etching solution containing hydrofluoric acid. After etching the bonding layer 103, the grid film layer 202 having the opening 204 is suspended. After etching a part of the bonding layer 103, a sub-recess (not shown in the drawing) formed in the bonding layer 103 serves as a part of the recess 111.

Figure 17:
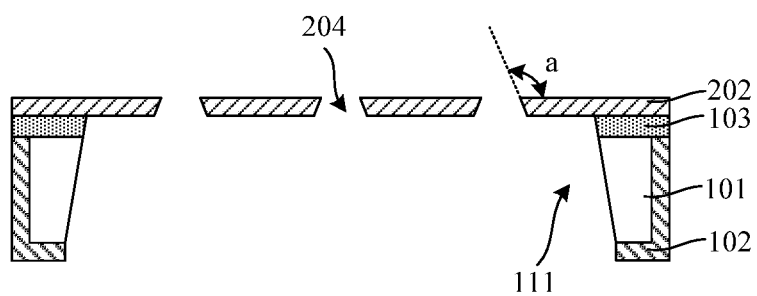

Referring to FIG. 17, the patterned second photoresist layer 110 is removed (referring to FIG. 15).

In an embodiment, the second photoresist layer 110 may be removed using an ashing process.

FIGS. 18 to 32 are structural schematic diagrams showing a manufacturing process of a shadow mask for OLED evaporation according to another embodiment of the present disclosure. The difference between the present embodiment and the foregoing embodiment lies in that a mesh-shaped support layer is formed on the surface of the grid film layer exposed by the recess (the back surface of the grid film layer between adjacent openings), in order to increase the strength of the formed shadow mask (suspended and having the grid film layer) and prevent the shadow mask (suspended and having the grid film layer) from being deformed and improve the service life. It should be noted that, the description or the definition of the similar or identical structure in the present embodiment and in the foregoing embodiment can be referred to the description or definition of the corresponding structure in the foregoing embodiment, and details are not described in the present embodiment.

Figure 18:
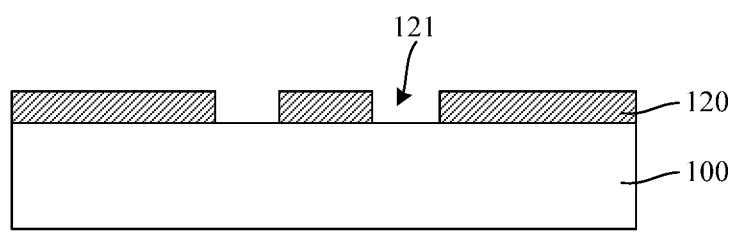
FIG. 18 to FIG. 32 are structural schematic diagrams showing a process for manufacturing a shadow mask for OLED evaporation according to another embodiment of the present disclosure.
Figure 19:
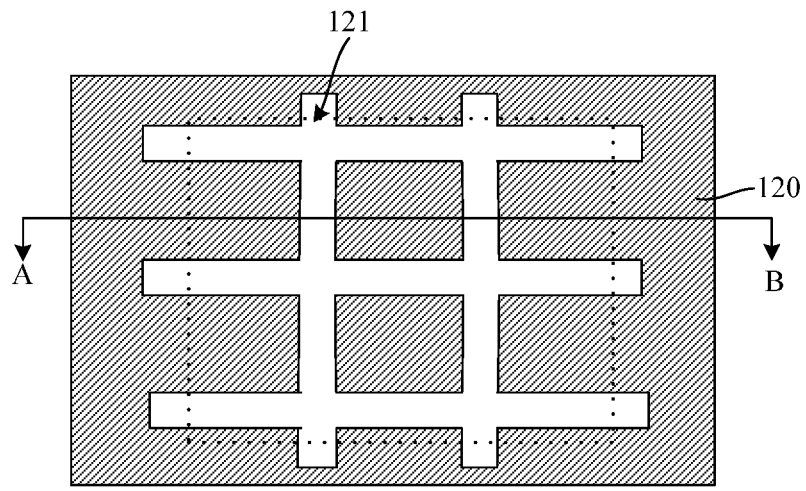

Referring to FIG. 18 and FIG. 19, FIG. 19 is a schematic top diagram of a portion of the structure of FIG. 18, and FIG. 18 is a cross-sectional structural schematic diagram of FIG. 19 taken along a cutting line AB. Before the step of forming a bonding layer on the front surface of the second semiconductor substrate 101, a third hard mask layer 120 is formed on the front surface of the second semiconductor substrate 101. The third hard mask layer 120 has a mesh-shaped opening 121 exposing the front surface of the second semiconductor substrate 101.

The material of the third hard mask layer 120 may be one or more of silicon nitride, silicon oxide, silicon carbide, silicon carbonitride, titanium nitride, tantalum nitride, and metal oxide.

The third hard mask layer 120 is a mask for use in subsequently forming the mesh-shaped support layer in the second semiconductor substrate 101. A mesh-shaped opening 121 is formed in the third hard mask layer 120 by a photolithography and etching process. The shape and position of the mesh-shaped opening 121 correspond to the shape and position of the mesh-shaped support layer subsequently formed in the second semiconductor substrate 101.

The mesh-shaped opening 121 may be composed of a number of laterally and/or longitudinally arranged openings, and the lateral opening and the corresponding longitudinal opening interpenetrate each other. The mesh-shaped opening 121 has a number of meshes correspondingly. When the mesh-shaped support layer is subsequently formed in the second semiconductor substrate 101, the position of the mesh-shaped opening corresponds to the position of the support layer. After the mesh-shaped support layer is formed, when the first semiconductor substrate and the second semiconductor substrate are subsequently bonded, the mesh-shaped support layer is located on the back surface of the grid film layer having an opening. When the grid film layer having an opening is suspended, the mesh-shaped support layer can support the suspended grid film layer having an opening, thereby preventing deformation of the grid film layer and improving the service life. In order to enable the support layer formed into a mesh shape to be located on the back surface of the grid film layer between adjacent openings, each mesh in the mesh-shaped opening 121 formed in the third hard mask layer 120 is correspondingly located around one or more openings subsequently formed in the grid film layer.

Moreover, in order to further improve the support strength of the subsequently formed mesh-shaped support layer, the mesh-shaped support layer, in addition to being located on the back surface of the grid film layer between the openings, is at least partially connected to a part of the second semiconductor substrate exposed by the recess (the recess is subsequently formed by etching the second semiconductor substrate), or the mesh-shaped support layer is at least partially located in the second semiconductor substrate exposed by the recess. In order to form such a mesh-shaped support layer to correspond to the mesh-shaped opening 121 in the third hard mask layer 120, referring to FIG. 12, the mesh-shaped opening in the dotted box corresponds to the part of the mesh-shaped support layer on the back surface of the grid film layer between the adjacent openings, and the mesh-shaped opening outside the dotted box corresponds to the part of the mesh-shaped support layer connected to the remaining second semiconductor substrate after the second semiconductor substrate is subsequently etched to form a recess. It should be noted that the mesh-shaped opening shown in FIG. 12 is only an example, which does not limit the protection scope of the present disclosure. In other embodiments, the mesh-shaped opening may include only lateral openings or longitudinal openings, or a number of grids may be arranged regularly or irregularly.

Figure 20:
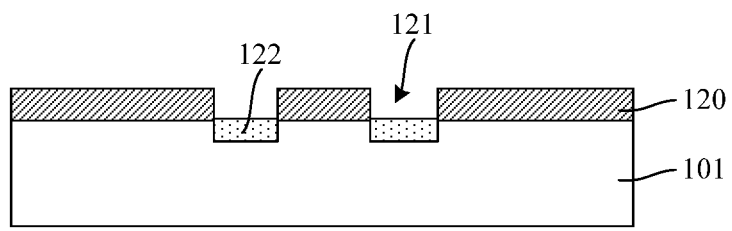

Referring to FIG. 20, a mesh-shaped support layer 122 is formed in the second semiconductor substrate 101 along the mesh-shaped opening 121. The mesh-shaped support layer surface 122 is flush with the front surface of the second semiconductor substrate 101.

The formation process of the mesh-shaped support layer 122 includes: doping B into the exposed second semiconductor substrate 101 along the mesh-shaped opening 121; and then performing annealing to form the mesh-shaped support layer 122.

In the present embodiment, by doping B in the second semiconductor substrate 101, when the second semiconductor substrate is subsequently etched along the back surface of the second semiconductor substrate 101 to form a recess by using the TMAH or KOH etching solution, the etching rate on the second semiconductor substrate material doped with B is much smaller than the etching rate on the second semiconductor substrate material that is not doped with B, such that when forming the recess, the B-doped second semiconductor substrate material on the back surface of the grid film layer between the openings is retained as the mesh-shaped support layer, thereby making it simple and convenient to form a mesh-shaped support layer with the high mechanical strength and good morphology. Moreover, in order to make the mesh-shaped support layer have the better support capability and mechanical strength, the formed mesh-shaped support layer is generally thick (1 to 10 micrometers). B can be doped to a deep depth under the existing doping process, and then an annealing process is carried out to cause the doped B to diffuse, thereby forming a mesh-shaped support layer having a large thickness and reducing the difficulty of the process.

In one embodiment, a concentration of the doped B is greater than 1E22 atom/$cm^3$, and may be 2E22 atom/$cm^3$, 3E22 atom/$cm^3$, 5E22 atom/$cm^3$, 8E22 atom/$cm^3$, 1E23 atom/$cm^3$, 3E23 atom/$cm^3$, 5E23 atom/$cm^3$, 8E23 atom/$cm^3$ or 1E24 atom/cm$^3$. When the second semiconductor substrate is subsequently etched along the back surface of the second semiconductor substrate 101 by using the TMAH or KOH etching solution to form a recess, the etched amount of the second semiconductor substrate material by the TMAH or KOH etching solution at such doping concentrations of B is negligible, such that the second semiconductor substrate doped with B can be completely retained as a mesh-shaped support layer, and the mesh-shaped support layer has a good morphology. In addition, a doping depth of B is 1 to 10 micrometers, such that the thickness of the subsequently formed mesh-shaped support layer is at least 1 to 10 micrometers, which ensures the mechanical strength and mechanical stability of the mesh-shaped support layer itself, so as to better support the grid film layer having an opening on the surface and to prevent the mesh-shaped support layer from being too thin, which would otherwise cause it to be damaged in the subsequent process, and also prevent the mesh-shaped support layer from being too thick, which would otherwise deteriorate the shadow effect caused during evaporation. The process of doping B may be ion implantation, gas source diffusion, and solid source diffusion.

In an embodiment, in order to make the concentration of the doped B uniform and make the depth meet the requirements, when the process of doping B is ion implantation, the energy of the ion implantation is greater than 500 KeV and a dose is greater than 1E17/cm2; the gas source diffusion uses gas of B2H6, a temperature greater than 600° C. and a pressure of 200 to 300 mtorr; and the solid source diffusion uses a boron nitride sheet as a solid source, gas of N2, a temperature of 1000 to 1200° C. and a pressure of 300 mtorr.

After the doping of B, annealing is performed to diffuse the doped B. In one embodiment, a temperature for the annealing is 1000 to 1200° C. and time for the annealing is 1 to 10 hours.

Figure 21:
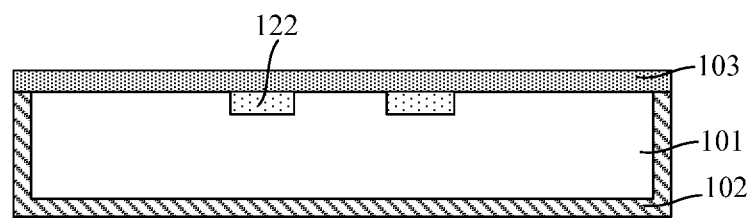

Referring to FIG. 21, the third hard mask layer 120 is removed (referring to FIG. 20). A second hard mask layer 102 is formed on the side surfaces and the back surface of the second semiconductor substrate 101, and a bonding layer 103 is formed on the front surface of the second semiconductor substrate 101.

The formation process and related definitions of the second hard mask layer 102 and the bonding layer 103 in the foregoing embodiments can be referred for the formation process and definition of the second hard mask layer 102 and the bonding layer 103, and details thereof will not be described herein again.

Figure 22:
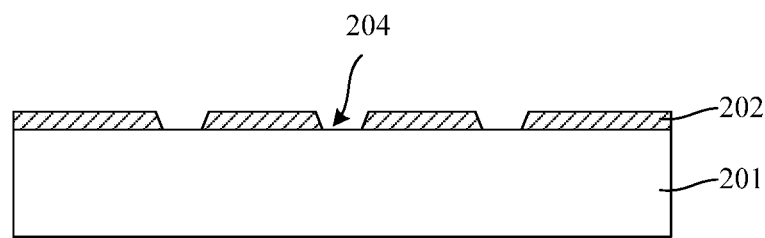

Referring to FIG. 22, a first semiconductor substrate 201 is provided, and a grid film layer 202 is formed on the front surface of the first semiconductor substrate 201; and a number of openings 204 arranged in an array are formed in the grid film layer 202, and a width of the upper portion of the opening 204 is greater than a width of the lower portion of the opening. It should be noted that an upper portion of the opening 204 is a portion of the opening facing away from the front surface of the first semiconductor substrate 201, and the lower portion of the opening is a portion of the opening close to the front surface of the first semiconductor substrate 201.

Figure 23:
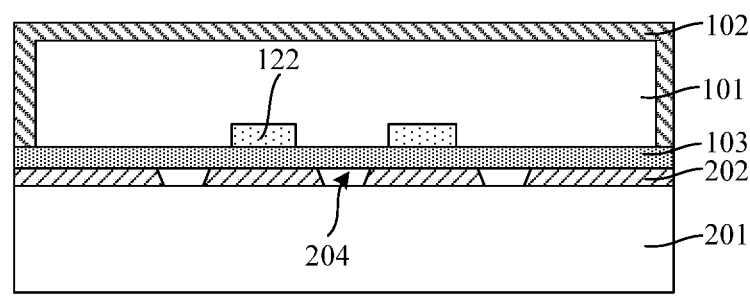

Referring to FIG. 23, the second semiconductor substrate 101 and the first semiconductor substrate 201 are bonded, and the front surface of the second semiconductor substrate 101 faces the grid film layer 202 on the front surface of the first semiconductor substrate 201.

Figure 24:
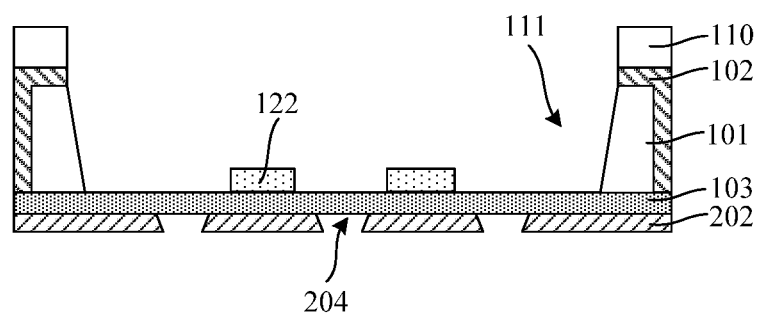
Figure 25:
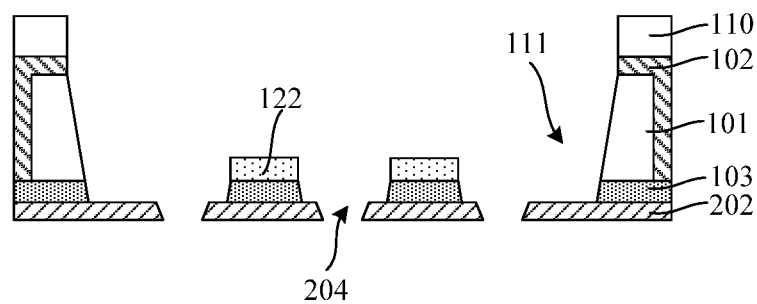

Referring to FIGS. 24 to 25, etching is performed along the back surface of the second semiconductor substrate 101 to remove a part of the second semiconductor substrate 101, so as to form a recess 111 in the second semiconductor substrate 101. The recess 111 exposes a number of openings 204 in the grid film layer 202 and a mesh-shaped support layer on the surface (back surface) of the grid film layer between adjacent openings 204.

In the present embodiment, the forming process of the recess 111 includes: forming a patterned second photoresist layer 110 on the surface of the second hard mask layer 102 on the back surface of the second semiconductor substrate 101; etching the second hard mask layer 102 on the back surface of the second semiconductor substrate 101 by using the patterned second photoresist layer 110 as a mask; referring to FIGS. 15 and 16, then etching the second semiconductor substrate 101 and the bonding layer 103 along the back surface of the second semiconductor substrate 101, to form a recess 111, which exposes a number of openings 204 in the grid film layer 202 and the mesh-shaped support on the surface (back surface) of the grid film layer between the adjacent openings 204, in the semiconductor substrate 101 and the bonding layer 103. It should be noted that in the present embodiment, the surface of the grid film layer 202 close to the recess 111 is defined as the back surface, and the surface of the grid film layer 202 facing away from the recess 111 is defined as the front surface.

Etching the second semiconductor substrate 101 employs a wet etching process, and the etching solution used for the wet etching is TMAH (tetramethylammonium hydroxide) or KOH solution. Due to the different etching rates of the TMAH (tetramethylammonium hydroxide) or KOH solution on silicon materials having different crystal orientations when etching silicon materials, it is possible to easily form the recess 111 having an upper portion with a large width and a lower portion with a small width. Moreover, since a part of the second semiconductor substrate 101 is doped with a high concentration of B, and the etching rate of TMAH (tetramethylammonium hydroxide) or KOH solution on the second semiconductor substrate material doped with a high concentration of B is extremely low, when etching, the part of the second semiconductor substrate material that is doped with a high concentration of B and in contact with the bonding layer 103 is retained as a mesh-shaped support layer 122. In addition, when etching, the etching rate of the etching solution on the material of the second hard mask layer 102 is extremely low, so that the second hard mask layer 102 on the side surface of the second semiconductor substrate 101 protects the side surface of the second semiconductor substrate from being etched. Moreover, when etching, the etching rate of the etching solution on the grid film layer 202 is also extremely low, so that the grid film layer 202 can be kept intact.

In an embodiment, the width of the mesh-shaped support layer 122 is smaller than the width of the grid film layer 120 between adjacent openings 108, such that at the time of evaporation, the mesh-shaped support layer 122 does not affect the diffusion of the evaporation gas, and the generation of the shadow effect is prevented. Correspondingly, when the bonding layer 103 is being etched, the bonding layer 103 between the mesh-shaped support layer 122 and the grid film layer 202 is retained. Further, the width of the bonding layer 103 remaining between the mesh-shaped support layer 122 and the grid film layer 202 is also smaller than the width of the grid film layer 202 between the openings, such that the bonding layer 103 remaining between the mesh-shaped support layer 122 and the grid film layer 202 does not affect the diffusion of the evaporation gas, thereby preventing the generation of the shadow effect.

Etching the bonding layer 103 employs a wet etching process or a dry etching process. In an embodiment, the etching solution used in the wet etching process is an etching solution containing hydrofluoric acid. It should be noted that after etching a part of the bonding layer 103, a sub-recess (not shown in the drawing) formed in the bonding layer 103 is formed as a part of the recess 111.

Figure 26:
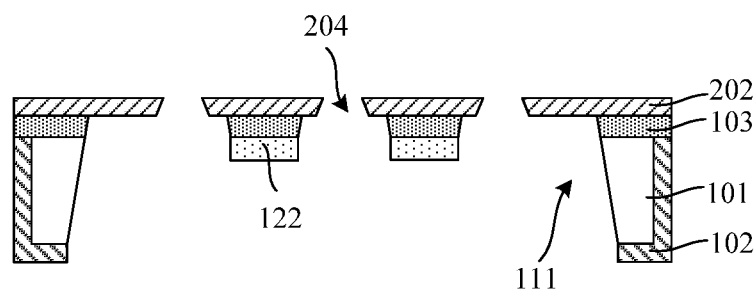
Figure 27:
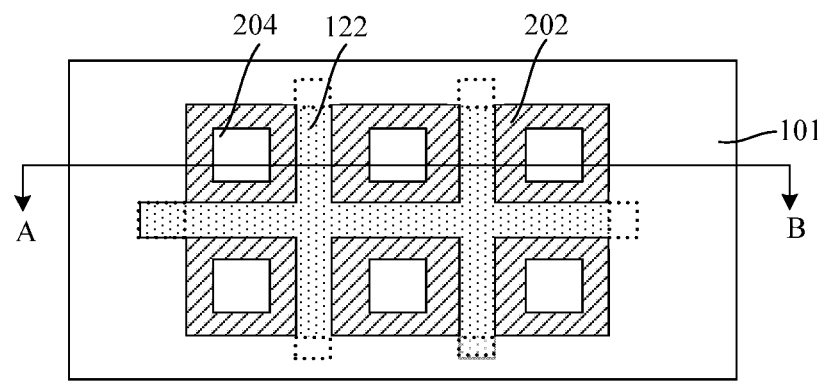

Referring to FIGS. 26 and 27, FIG. 27 is a top schematic diagram of a portion of the structure in FIG. 26 (the second hard mask layer 102 on the back surface of the second semiconductor substrate in FIG. 26 is not shown), and FIG. 26 is a cross-sectional structural schematic diagram of FIG. 27 taken along the direction of the cutting line AB, with the patterned second photoresist layer 110 being removed (referring to FIG. 25).

Referring to FIG. 27, in addition to a part of the mesh-shaped support layer 122 (the pattern filled with dots in the solid line box in FIG. 27) located on the surface (back surface) of the grid film layer 202 between the adjacent openings 204, at least a part (the pattern filled with dots in the selection box in FIG. 27) of the mesh-shaped support layer 122 is also connected to a part of the second semiconductor substrate 101 exposed by the recess 111 (referring to FIG. 26), or at least a part of the mesh-shaped support layer 122 (the pattern filled with dots in the selection box in FIG. 20) is also located in the semiconductor substrate 101 exposed by the recess. Namely, at least a part of the mesh-shaped support layer 122 is connected to the second semiconductor substrate 101 remaining after form the recess 111 by etching, which is advantageous for improving the mechanical strength and supporting ability of the mesh-shaped support layer.

In order to further explain the structure of the mesh-shaped support layer in the present disclosure, FIGS. 28 to 32 are several specific examples of the mesh-shaped support layer (The second hard mask layer on the back surface of the second semiconductor substrate is not shown in FIGS. 28 to 32, and for clarity of illustration, the portion of the mesh-shaped support layer located in the second semiconductor substrate 101 and the portion of the grid film layer located on the back surface of the grid film layer 202 between adjacent openings 204 are separated by a hyperbolic break line, but the two are actually connected together). It should be noted that, in practical applications, there are numerous openings 204 formed in the grid film layer 202 and numerous meshes in the mesh-shaped support layer, and for convenience of illustration in the present disclosure, the number of the openings 204 and meshes shown in FIGS. 21-25 is for illustrative purposes only, and the number of the openings 204 and meshes should not limit the scope of the present disclosure.

Figure 28:
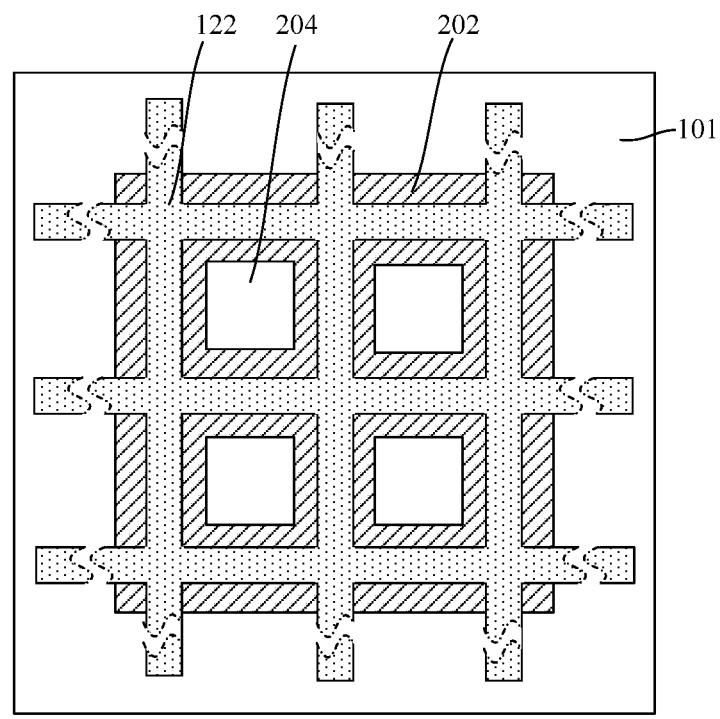

Referring to FIG. 28, the mesh-shaped support layer 122 has multiple interconnected lateral support structures and longitudinal support structures, and the multiple lateral support structures and longitudinal support structures are interconnected to form multiple grids. Each of the openings 204 in the grid film layer 202 is surrounded by one grid in the mesh-shaped support layer 122, and at least a portion (the edge of the mesh-shaped support layer 122 or the periphery thereof) of the mesh-shaped support layer 122 is connected to a part of the second semiconductor substrate 101 exposed by the recess, or the mesh-shaped support layer is at least partially located in the second semiconductor substrate 101 exposed by the recess.

Figure 29:
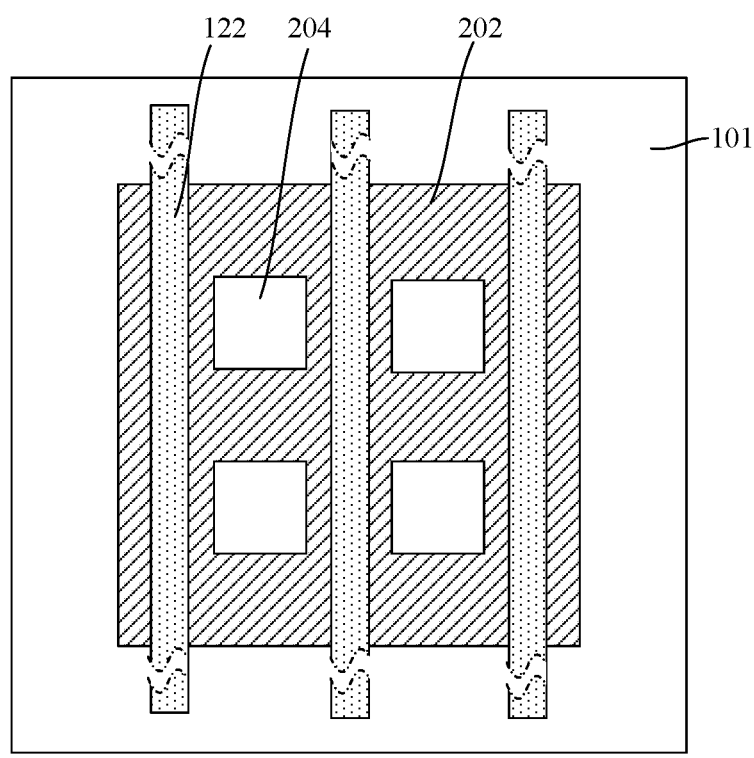

Referring to FIG. 29, the mesh-shaped support layer 122 may include only lateral support structures or longitudinal support structures. A grid is defined between adjacent lateral support structures (or longitudinal support structures), and at least one opening in the grid film layer 202 is surrounded by one grid.

Figure 30:
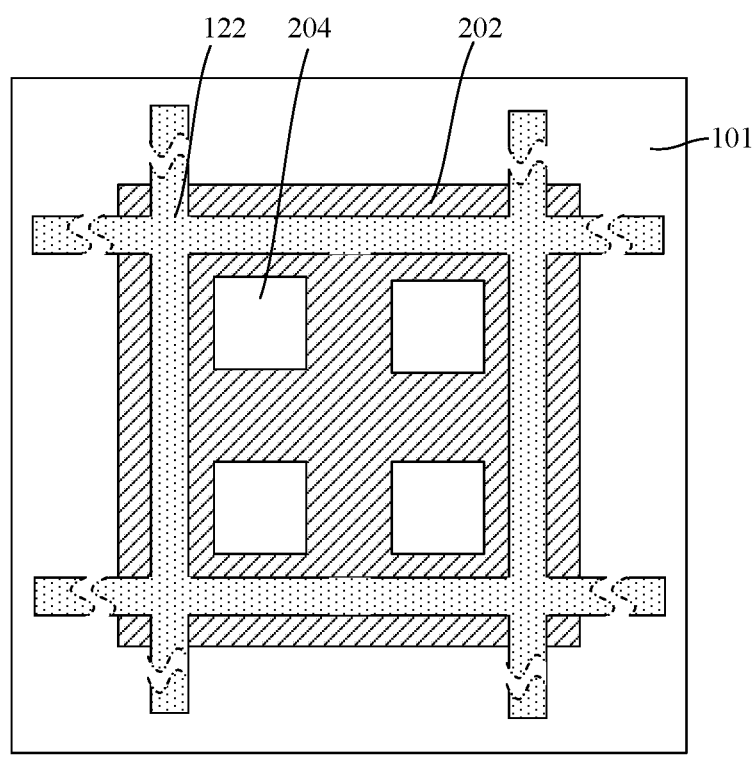

Referring to FIG. 30, the mesh-shaped support layer 122 has multiple interconnected lateral support structures and longitudinal support structures, and multiple lateral support structures and longitudinal support structures are interconnected to form multiple grids. One grid of mesh-shaped support layers 122 may surround at least one opening 204 in the grid film layer 202.

Figure 31:
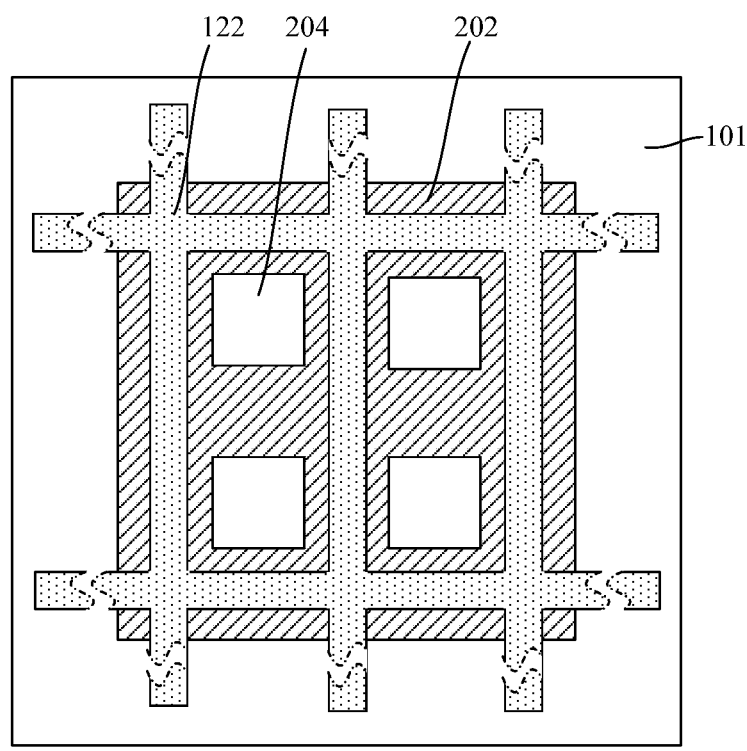

Referring to FIG. 31, the number of lateral support structures and the number of longitudinal support structures in the mesh-shaped support layer 122 may be different, and multiple lateral support structures and longitudinal support structures are interconnected to form multiple grids. One grid of the mesh-shaped support layer 122 may surround at least one opening 204 in the grid film layer 202.

Figure 32:
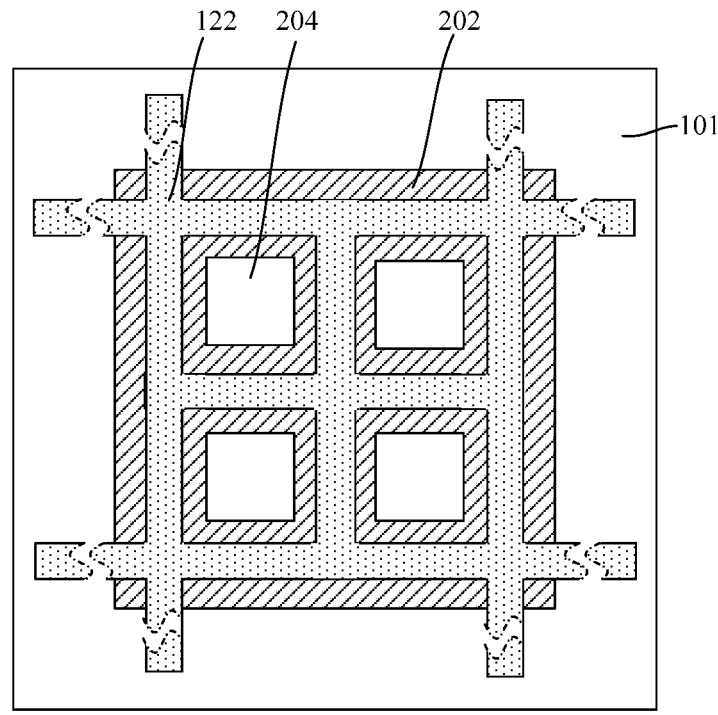

Referring to FIG. 32, when the mesh-shaped support layer 122 has multiple interconnected lateral support structures and longitudinal support structures, it is possible that only the edge or two ends of part of the lateral support structures and/or the longitudinal support structures is connected to a part of the semiconductor substrate 101 exposed by the recess, or the mesh-shaped support layer is at least partially located in the semiconductor substrate 101 exposed by the recess.

Referring to FIG. 17 and FIG. 26, an embodiment of the present disclosure further provides a shadow mask for OLED evaporation, including:

a semiconductor substrate 101, the semiconductor substrate 101 including a front surface and a back surface opposite thereto, the semiconductor substrate 101 having a recess 111 penetrating the front surface and the back surface; and a grid film layer 202 located on the front surface of the semiconductor substrate 101, a number of openings 204 arranged in an array being provided in the grid film layer 202, and a width of an upper portion of the opening 204 being smaller than a width of a lower portion, the recess 111 exposing a number of openings 204 in the grid film layer 202 and the grid film layer between adjacent openings.

It should be noted that the upper portion of the opening 204 represents a portion of the opening 204 facing away from the front surface of the semiconductor substrate 101, and the lower portion of the opening 204 represents a portion of the opening 204 close to the front surface of the semiconductor substrate 101.

In an embodiment, the grid film layer 202 has tensile stress.

In an embodiment, the material of the grid film layer 202 is silicon nitride, the grid film layer 202 has a thickness of 1 to 1.5 micrometers, the tensile stress in a magnitude of 100 to 400 MPa, and the surface roughness smaller than 20 nanometers.

In an embodiment, an inclination angle a of a sidewall of the opening 204 is 130° to 170°. The opening has a size of 2 to 20 micrometers. The inclination angle of the sidewall of the opening 204 is an angle between a sidewall surface of the opening or a tangent to the sidewall surface of the opening and the front surface of the semiconductor substrate 101.

In another embodiment, the material of the grid film layer 202 is silicon oxide or silicon oxynitride.

A bonding layer 103 is disposed between the front surface of the semiconductor substrate 101 and the grid film layer 202. In an embodiment, the material of the bonding layer 103 is silicon oxide.

In an embodiment, referring to FIG. 26, the back surface of the grid film layer 202 between the openings 204 is further provided with a mesh-shaped support layer 122. The recess 111 also exposes the mesh-shaped support layer 122. It should be noted that the back surface of the grid film layer 202 refers to the surface of the grid film layer 202 close to the front surface of the semiconductor substrate 101. In an embodiment, a bonding layer is further provided between the mesh-shaped support layer 122 and the back surface of the grid film layer 202.

In an embodiment, the material of the mesh-shaped support layer 122 is a B-doped semiconductor substrate material.

In an embodiment, the concentration of B doped in the mesh-shaped support layer is greater than 1E22 atoms/cm$^3$, and the thickness of the mesh-shaped support layer is 1-10 micrometers.

In an embodiment, the width of the mesh-shaped support layer 122 is smaller than the width of the grid film layer 202 between adjacent openings 204. The width of the bonding layer between the mesh-shaped support layer 122 and the grid film layer 202 is smaller than the width of the grid film layer 202 between adjacent openings 204.

In an embodiment, in addition to a part of the mesh-shaped support layer 122 provided on the back surface of the grid film layer 202 between adjacent openings, at least a part of the mesh-shaped support layer 122 is connected to a part of the semiconductor substrate 101 exposed by the recess 111, or the mesh-shaped support layer 122 is at least partially located in the semiconductor substrate 101 exposed by the recess 111.

In an embodiment, the material of the semiconductor substrate 101 is silicon or germanium.

It should be noted that the corresponding definition or description in the part of the forming process of the mask for OLED evaporation described above can be referred for other definitions or descriptions of the shadow mask used for OLED evaporation, and details thereof will not be described herein again.

Figure 33:
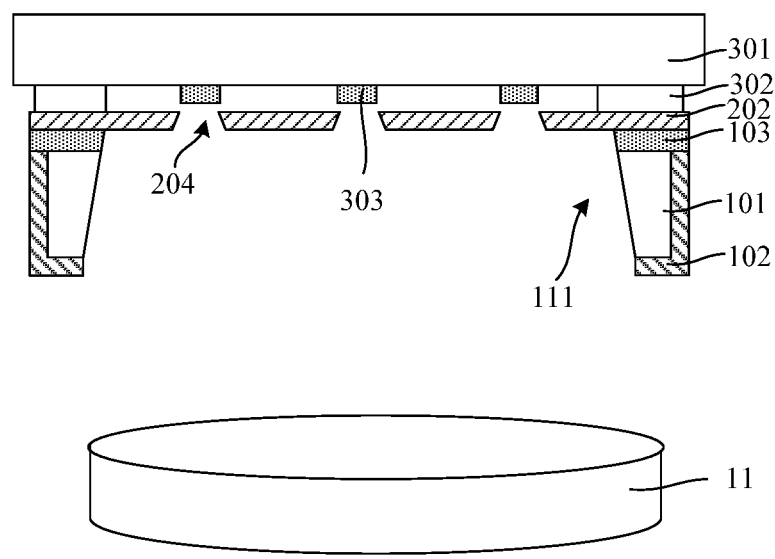
FIG. 33 is a structural schematic diagram showing manufacturing of an OLED panel by using a shadow mask according to the present disclosure.

Referring to FIG. 33, another embodiment of the present disclosure further provides a method for manufacturing an OLED panel using the shadow mask described above. including:

providing a base plate 301;

transferring the base plate 301 into an evaporation chamber;

placing the shadow mask on the surface of the base plate 301, such that the openings 204 in the grid film layer 202 on the shadow mask face the surface of the base plate 301 to expose a part of the surface of the base plate 301 by the openings 204 in the grid film layer, the recess 111 in the shadow mask facing an evaporation source 11; and diffusing a gaseous light-emitting material generated by the evaporation source 11 onto the base plate 301 through the recess 111 and the openings 204 of the shadow mask, and forming, on the base plate 301, a light-emitting unit 303 corresponding to the openings 108.

One light-emitting material, such as one of red, green and blue light-emitting materials, is evaporated at a time. After evaporating one light-emitting material in the evaporation chamber, the silicon substrate can be transferred to another evaporation chamber, such that another light-emitting material is evaporated in a similar scheme, and so on, until the three light-emitting materials are evaporated.

Although the present disclosure has been disclosed above, the present disclosure is not limited thereto. Any changes and modifications may be made by those skilled in the art without departing from the spirit and scope of the disclosure, and the scope of the present disclosure should be determined by the scope defined by the appended claims.

What is claimed is:

1. A method for manufacturing a shadow mask for OLED evaporation, comprising:
   providing a first semiconductor substrate, the first semiconductor substrate comprising a front surface and a back surface opposite thereto;
   forming a grid film layer on the front surface of the first semiconductor substrate;
   forming a number of openings arranged in an array in the grid film layer, wherein each of the openings has an upper portion and a lower portion and a width of the upper portion is greater than a width of the lower portion;
   providing a second semiconductor substrate, the second semiconductor substrate comprising a front surface and a back surface opposite thereto;
   bonding the second semiconductor substrate and the first semiconductor substrate, the front surface of the second semiconductor substrate facing the grid film layer on the front surface of the first semiconductor substrate;
   performing etching along the back surface of the second semiconductor substrate to remove a part of the second semiconductor substrate to form a recess in the second semiconductor substrate, the recess exposing the number of openings in the grid film layer and the grid film layer between adjacent openings; and
   removing the first semiconductor substrate to expose the grid film layer and the openings in the grid film layer.

2. The method for manufacturing a shadow mask for OLED evaporation according to claim 1, wherein a process of forming the grid film layer comprises: forming a grid thin film layer covering the front surface, the back surface, and side surfaces of the first semiconductor substrate; forming a first hard mask layer on a surface of the grid thin film layer on the front surface of the first semiconductor substrate; and performing etching to remove the grid thin film layer on the back surface and the side surfaces of the first semiconductor substrate, the grid thin film layer remaining on the front surface of the first semiconductor substrate serving as the grid film layer.

3. The method for manufacturing a shadow mask for OLED evaporation according to claim 2, wherein the grid film layer and the grid thin film layer have tensile stress.

4. The method for manufacturing a shadow mask for OLED evaporation according to claim 2, wherein a process of forming a number of openings in the grid film layer comprises: patterning the first hard mask layer; etching the grid film layer remaining on the front surface of the first semiconductor substrate by using the patterned first hard mask layer as a mask, to form the number of openings arranged in an array in the grid film layer; and removing the patterned first hard mask layer.

5. The method for manufacturing a shadow mask for OLED evaporation according to claim 4, wherein an inclination angle of a sidewall of each of the openings is 40° to 80°, and a size of each of the openings is 2 to 20 micrometers.

6. The method for manufacturing a shadow mask for OLED evaporation according to claim 1, further comprising, prior to said bonding: forming a second hard mask layer covering the back surface and side surfaces of the second semiconductor substrate; and forming a bonding layer on the front surface of the second semiconductor substrate.

7. The method for manufacturing a shadow mask for OLED evaporation according to claim 6, wherein a material of the bonding layer is silicon oxide.

8. The method for manufacturing a shadow mask for OLED evaporation according to claim 6, wherein a process of forming the recess comprises: forming a patterned second photoresist layer on a surface of the second hard mask layer on the back surface of the second semiconductor substrate; etching the second hard mask layer on the back surface of the second semiconductor substrate by using the patterned second photoresist layer as a mask; and then etching the second semiconductor substrate and the bonding layer along the back surface of the second semiconductor substrate, to form the recess in the semiconductor substrate and the bonding layer, the recess exposing the number of openings in the grid film layer and the grid film layer between adjacent openings.

9. The method for manufacturing a shadow mask for OLED evaporation according to claim 8, wherein the first semiconductor substrate is removed while etching the second semiconductor substrate.

10. The method for manufacturing a shadow mask for OLED evaporation according to claim 6, further comprising, prior to said forming the second hard mask layer forming a third hard mask layer on the front surface of the second semiconductor substrate, the third hard mask layer having a mesh-shaped opening exposing the front surface of the second semiconductor substrate; forming a mesh-shaped support layer in the second semiconductor substrate along the mesh-shaped opening, a surface of the support layer being flush with the front surface of the second semiconductor substrate; and removing the third hard mask layer.

11. The method for manufacturing a shadow mask for OLED evaporation according to claim 10, wherein a process of forming the mesh-shaped support layer comprises: doping B into the exposed second semiconductor substrate along the mesh-shaped opening; and then performing annealing.

12. The method for manufacturing a shadow mask for OLED evaporation according to claim 10, wherein after said bonding, the mesh-shaped support layer is located on the bonding layer on a back surface of the grid film layer between adjacent openings.

13. The method for manufacturing a shadow mask for OLED evaporation according to claim 12, wherein a width of the mesh-shaped support layer is smaller than a width of the grid film layer between adjacent openings.

14. The method for manufacturing a shadow mask for OLED evaporation according to claim 13, wherein after the recess is formed, at least a part of the mesh-shaped support layer is connected to a part of the second semiconductor substrate exposed by the recess, or the mesh-shaped support layer is at least partially located in the second semiconductor substrate exposed by the recess.

15. A shadow mask for OLED evaporation, comprising:
a semiconductor substrate comprising a front surface and a back surface opposite thereto, a recess penetrating the front surface and the back surface being provided in the semiconductor substrate;
a grid film layer provided on the front surface of the semiconductor substrate, a number of openings arranged in an array being provided in the grid film layer, wherein each of the openings has an upper portion and a lower portion, a width of the upper portion is greater than a width of the lower portion, and the recess exposes the number of openings in the grid film layer and the grid film layer between adjacent openings; and
a bonding layer between the front surface of the semiconductor substrate and the grid film layer.

16. The shadow mask for OLED evaporation according to claim 15, wherein the grid film layer has tensile stress.

17. The shadow mask for OLED evaporation according to claim 16, wherein a material of the grid film layer is silicon nitride, the grid film layer has a thickness of 1 to 1.5 micrometers, the tensile stress in a magnitude of 100 to 400 MPa, and a surface roughness smaller than 20 nanometers.

18. The shadow mask for OLED evaporation according to claim 15, wherein an inclination angle of a sidewall of each of the openings is 130° to 170°, and a size of each of the openings is 2 to 20 micrometers.

19. The shadow mask for OLED evaporation according to claim 16, wherein a material of the grid film layer is silicon oxide or silicon oxynitride.

20. The shadow mask for OLED evaporation according to claim 15, wherein a back surface of the grid film layer between the openings is further provided with a mesh-shaped support layer, and the recess exposes the mesh-shaped support layer.

21. The shadow mask for OLED evaporation according to claim 20, wherein a material of the mesh-shaped support layer is a B-doped semiconductor substrate material.

22. The shadow mask for OLED evaporation according to claim 21, wherein a concentration of B doped in the mesh-shaped support layer is greater than 1E22 atom/cm3, and a thickness of the mesh-shaped support layer is 1 to 10 micrometers.

23. The shadow mask for OLED evaporation according to claim 20, wherein a bonding layer is provided between the mesh-shaped support layer and the back surface of the grid film layer between adjacent openings.

24. The shadow mask for OLED evaporation according to claim 20, wherein a width of the mesh-shaped support layer is smaller than a width of the grid film layer between adjacent openings.

25. The shadow mask for OLED evaporation according to claim 20, wherein in addition to a part of the mesh-shaped support layer provided on the back surface of the grid film layer between adjacent openings, at least a part of the mesh-shaped support layer is connected to a part of the semiconductor substrate exposed by the recess, or at least a part of the mesh-shaped support layer is located in the semiconductor substrate exposed by the recess.

* * * * *